United States Patent
Shih et al.

(10) Patent No.: US 11,610,833 B2
(45) Date of Patent: Mar. 21, 2023

(54) CONDUCTIVE FEATURE WITH NON-UNIFORM CRITICAL DIMENSION AND METHOD OF MANUFACTURING THE SAME

(71) Applicant: NANYA TECHNOLOGY CORPORATION, New Taipei (TW)

(72) Inventors: Shing-Yih Shih, New Taipei (TW); Jheng-Ting Jhong, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 147 days.

(21) Appl. No.: 17/077,842

(22) Filed: Oct. 22, 2020

(65) Prior Publication Data

US 2022/0130736 A1    Apr. 28, 2022

(51) Int. Cl.
| | | |
|---|---|---|
| H01L 21/00 | (2006.01) | |
| H01L 23/48 | (2006.01) | |
| H01L 23/00 | (2006.01) | |
| H01L 21/768 | (2006.01) | |
| H01L 21/3065 | (2006.01) | |

(52) U.S. Cl.
CPC ...... *H01L 23/481* (2013.01); *H01L 21/76898* (2013.01); *H01L 24/32* (2013.01); *H01L 24/83* (2013.01); *H01L 21/30655* (2013.01); *H01L 2224/32145* (2013.01); *H01L 2224/83203* (2013.01); *H01L 2224/83896* (2013.01)

(58) Field of Classification Search
CPC .. H01L 23/481; H01L 21/76898; H01L 24/32
See application file for complete search history.

(56) References Cited

U.S. PATENT DOCUMENTS

| | | | | |
|---|---|---|---|---|
| 6,100,195 A | * | 8/2000 | Chan | H01L 21/76858 257/E21.591 |
| 6,468,906 B1 | * | 10/2002 | Chan | H01L 21/76867 438/626 |
| 8,637,968 B2 | * | 1/2014 | Haba | H01L 21/76898 257/276 |
| 9,893,028 B2 | * | 2/2018 | Yu | H01L 24/06 |
| 10,818,508 B2 | * | 10/2020 | Lo | H01L 21/31144 |

(Continued)

FOREIGN PATENT DOCUMENTS

| | | | | | |
|---|---|---|---|---|---|
| CN | 114078712 A | * | 2/2022 | | |
| CN | 114388472 A | * | 4/2022 | ....... | H01L 21/76898 |

(Continued)

*Primary Examiner* — Laura M Menz
(74) *Attorney, Agent, or Firm* — Muncy, Geissler, Olds & Lowe, P.C.

(57) ABSTRACT

The present disclosure provides a semiconductor device, a semiconductor assembly and method of manufacturing the semiconductor assembly. The semiconductor device includes a substrate, a conductive feature in the substrate, an isolation liner between the substrate and the conductive feature, and a main component in the substrate. The conductive feature includes first to third blocks. The first block has a uniform first critical dimension, wherein the main component is disposed around the first block. The second block has a uniform second critical dimension greater than the first critical dimension. The third block is interposed between the first block and the second block and has varying third critical dimensions.

3 Claims, 30 Drawing Sheets

(56) References Cited

U.S. PATENT DOCUMENTS

| | | | |
|---|---|---|---|
| 10,916,502 B2* | 2/2021 | Chen | H01L 23/481 |
| 10,943,853 B2* | 3/2021 | Hu | H01L 25/50 |
| 11,004,733 B2* | 5/2021 | Weng | H01L 21/76897 |
| 11,289,402 B2* | 3/2022 | Park | H01L 23/481 |
| 11,315,869 B1* | 4/2022 | Huang | H01L 23/5223 |
| 11,315,904 B2* | 4/2022 | Shih | H01L 21/76852 |
| 11,355,342 B2* | 6/2022 | Su | H01L 21/0335 |
| 11,355,435 B2* | 6/2022 | Hsu | H01L 23/5283 |
| 11,355,464 B2* | 6/2022 | Shih | H01L 24/05 |
| 11,373,992 B2* | 6/2022 | Kuo | H01L 21/3086 |
| 11,374,009 B2* | 6/2022 | Shih | G11C 5/06 |
| 2010/0013060 A1* | 1/2010 | Lamy | H01L 23/481 257/E21.597 |
| 2012/0299194 A1 | 11/2012 | Lee et al. | |
| 2013/0193585 A1* | 8/2013 | Lin | H01L 21/3086 257/774 |
| 2017/0154850 A1* | 6/2017 | Kao | H01L 21/76898 |
| 2018/0068984 A1* | 3/2018 | Beyne | H01L 21/76898 |
| 2018/0342473 A1* | 11/2018 | Lu | H01L 24/05 |
| 2019/0013270 A1* | 1/2019 | Chen | H01L 23/5226 |
| 2019/0206841 A1 | 7/2019 | Kim et al. | |
| 2019/0259718 A1 | 8/2019 | Choi et al. | |
| 2020/0006128 A1* | 1/2020 | Weng | H01L 23/5226 |
| 2020/0075460 A1* | 3/2020 | Hu | H01L 21/31116 |
| 2020/0105578 A1* | 4/2020 | Park | H01L 23/528 |
| 2020/0273780 A1* | 8/2020 | Park | H01L 23/481 |
| 2021/0242080 A1* | 8/2021 | Weng | H01L 23/562 |
| 2021/0287981 A1* | 9/2021 | Shih | H01L 23/528 |
| 2021/0296276 A1* | 9/2021 | Huang | H01L 25/50 |
| 2021/0335725 A1* | 10/2021 | Shih | H01L 23/481 |
| 2021/0358889 A1* | 11/2021 | Shih | H01L 24/83 |
| 2021/0366820 A1* | 11/2021 | Uzoh | H01L 21/76898 |
| 2021/0375760 A1* | 12/2021 | Kao | H01L 23/5226 |
| 2022/0084884 A1* | 3/2022 | Shih | H01L 24/32 |
| 2022/0084885 A1* | 3/2022 | Han | H01L 23/3171 |
| 2022/0130726 A1* | 4/2022 | Liao | H01L 24/94 |
| 2022/0130736 A1* | 4/2022 | Shih | H01L 21/76898 |
| 2022/0139805 A1* | 5/2022 | Shih | H01L 21/76898 257/774 |
| 2022/0148995 A1* | 5/2022 | Shih | H01L 21/76898 |

FOREIGN PATENT DOCUMENTS

| | | | |
|---|---|---|---|
| TW | 201423942 A | 6/2014 | |
| TW | 201605012 A | 2/2016 | |
| TW | 201729364 A | 8/2017 | |
| TW | 201941317 A | 10/2019 | |
| TW | 202011468 A | 3/2020 | |
| WO | WO-2022083232 A1 * | 4/2022 | H01L 21/76898 |

* cited by examiner

CONDUCTIVE FEATURE WITH NON-UNIFORM CRITICAL DIMENSION AND METHOD OF MANUFACTURING THE SAME

TECHNICAL FIELD

The present disclosure relates to a conductive feature for a semiconductor device and a method of manufacturing the same, and more particularly, to a conductive feature with non-uniform critical dimension for a semiconductor device and a semiconductor assembly and a method of manufacturing the semiconductor assembly.

DISCUSSION OF THE BACKGROUND

Since the invention of integrated circuits, the semiconductor industry has experienced continuous rapid growth due to constant improvement in the integration density of various electronic components (i.e., transistors, diodes, resistors, capacitors, etc.). For the most part, this improvement in integration density has come from repeated reductions in minimum feature size, allowing more components to be integrated into a given chip area.

These integration improvements are essentially two-dimensional (2D) in nature, in that the volume occupied by the integrated components is essentially on the surface of the semiconductor wafer. Dramatic improvements in lithography have resulted in considerable improvements in 2D integrated circuit formation. However, due to the reduced size of the component, the contact area between conductive pads of the integrated components and bumps is decreased, such that delamination of the bumps and the conductive pad may easily occur, thereby adversely affecting the electrical performance and reliability of the semiconductor device.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a conductive feature, an isolation liner, and a main component. The conductive feature, disposed in the substrate, includes a first block, a second block and a third block. The first block has a uniform first critical dimension, and the second block has a uniform second critical dimension greater than the first critical dimension. The third block is interposed between the first block and the second block and has varying third critical dimensions. The isolation liner covers a periphery of the conductive feature, and the main component is disposed in the substrate and around the first block of the conductive feature.

In some embodiments, the third critical dimension of the third block of the conductive feature gradually increases at positions of increasing distance from the first block, and gradually decreases at positions of increasing distance from the second block.

In some embodiments, the first block of the conductive feature has a first height, the second block thereof has a second height greater than the first height, and the third block thereof has a third height less than the first height.

Another aspect of the present disclosure provides a semiconductor assembly. The semiconductor assembly includes a first semiconductor device, a second semiconductor device, a conductive feature, and an isolation liner. The first semiconductor device includes a conductive pad, and the second semiconductor device is vertically stacked on the first semiconductor device. The conductive feature penetrates through the second semiconductor device and includes a first block and a second block having different critical dimensions. The first block is in contact with the conductive pad and has a first critical dimension, and the second block is connected to the first block and has a second critical dimension greater than the first critical dimension. The isolation liner is interposed between the second semiconductor device and the conductive feature.

In some embodiments, the conductive feature further includes a third block interposed between the first block and the second block and having varying third critical dimensions.

In some embodiments, the third critical dimension of the third block of the conductive feature gradually increases at positions of increasing distance from the first block, and gradually decreases at positions of increasing distance from the second block.

In some embodiments, the second semiconductor device includes a substrate, a plurality of main components, and an insulative layer. The main components are disposed in the substrate and around the first block, and the insulative layer encapsulates the main components. A portion of the first block, the second block and the third block of the conductive feature are disposed in the substrate, and the other portion of the first block of the conductive feature penetrates through the insulative layer.

In some embodiments, the portion of the first block of the conductive feature in the substrate has a first height, the second block thereof has a second height greater than the first height, and the third block thereof has a third height less than the first height.

In some embodiments, a sum of the first height and the third height is less than the second height.

In some embodiments, the semiconductor assembly further includes a passivation layer capping the substrate, wherein a portion of the second block of the conductive feature is surrounded by the passivation layer.

In some embodiments, the semiconductor assembly further includes a bonding layer sandwiched between the first semiconductor device and the second semiconductor device, wherein the first block of the conductive feature penetrates through the bonding layer to contact the conductive pad.

Another aspect of the present disclosure provides a method of manufacturing a semiconductor assembly. The method of manufacturing the semiconductor assembly includes steps of bonding a first semiconductor device and a second semiconductor device together; performing a first cyclic process to create a plurality of first recesses in communication with each other in a substrate of the second semiconductor device, wherein the first recesses have a first width, and performing a second cyclic process to create a plurality of second recesses in communication with each other through the first recesses, wherein the second recesses have a second width less than the first width; forming an isolation liner on portions of the substrate exposed through the first and second recesses; and depositing a conductive material in the first and second recesses coated with the isolation liner.

In some embodiments, the first recesses are created utilizing the first cyclic process of alternating a deposition step and an etching step, and the second recesses are created utilizing the second cyclic process comprising a sequence of a first deposition step, a second deposition step and an etching step.

In some embodiments, a time duration of the etching step in the second cyclic process for etching the substrate is less than a time duration of the etching step in the first cyclic process for etching the substrate.

In some embodiments, the method further includes a step of performing a removal process on the substrate to remove a scalloped pattern generated during the etching steps of the first and second cyclic processes, thereby forming a trench, with a non-uniform width, penetrating through the substrate.

In some embodiments, the substrate exposed by the trench includes a first vertical surface, a second vertical surface and an inclined surface connected the first vertical surface and the second vertical surface.

In some embodiments, the method of manufacturing the semiconductor assembly further includes steps of depositing a passivation layer on the second semiconductor device, and creating an opening in the passivation layer prior to the performing of the first cyclic process, wherein the substrate is etched through the opening to create the first and second recesses.

In some embodiments, the bonding of the first semiconductor device and the second semiconductor device comprises steps of depositing dielectric films on the first semiconductor device and the second semiconductor device, respectively; mounting the second semiconductor device onto the first semiconductor device so that the dielectric films are in contact; and performing an anneal process to fuse the dielectric films, thereby forming a bonding layer for connecting the first and second semiconductor devices, wherein a portion of the bonding layer beneath the first and the second recesses is removed to expose the conductive pad prior to the forming of the isolation liner.

In some embodiments, the first cyclic process is performed until the substrate is etched to a selected depth, and the second cyclic process is completed once the connected first and second recesses penetrate through the substrate, wherein the second recess includes a default depth less than the selected depth.

With the above-mentioned configurations of the semiconductor assembly and semiconductor device, the footprint of the conductive feature in the vicinity of the main components is reduced, thereby increasing the area utilization of the substrate where the conductive feature is disposed.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
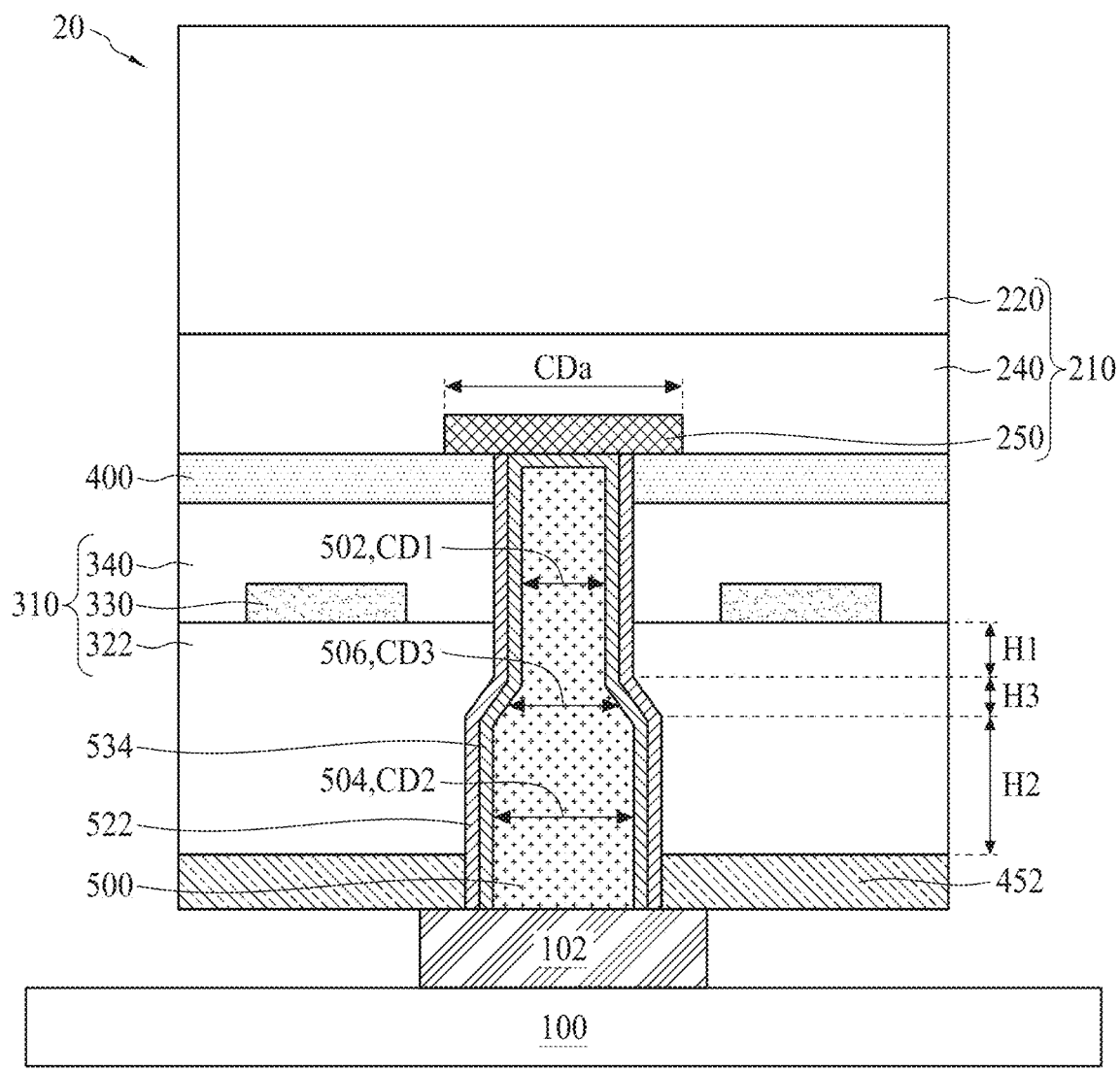
FIG. 1 is a cross-sectional view of an electronic system in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of an electronic system 10 in accordance with some embodiments of the present disclosure. Referring to FIG. 1, the electronic system 10 includes a circuit board 100 and a semiconductor assembly 20 electrically coupled to the circuit board 100 through at least one bump 102. The bumps 102 serve as input/output (I/O) connections to electrically connect the semiconductor assembly 20 to external devices that include a central processing unit (CPU) and a graphics processing unit (GPU) mounted on the circuit board 100.

The semiconductor assembly 20 includes a first semiconductor device 210 and a second semiconductor device 310 vertically stacked in a front-to-front configuration, and a conductive feature 500 penetrating through the second semiconductor device 310 for electrically coupling the first semiconductor device 210 to the bump 102, and hence to the circuit board 100. The first semiconductor device 210 and the second semiconductor device 310 may be fabricated using the same fabrication process. For example, the first semiconductor device 210 and the second semiconductor device 310 may form a memory stack. Alternatively, the first semiconductor device 210 and the second semiconductor device 310 may be fabricated using different fabrication processes. For example, one of the first semiconductor device 210 and the second semiconductor device 310 may be a memory device and the other of the first semiconductor device 210 and the second semiconductor device 310 may be a processor, an image sensor or an application-specific integrated circuit (ASIC) device.

The first semiconductor device 210 is bonded to the second semiconductor device 310 through a bonding layer 400, including insulative material. In particular, the first and second semiconductor devices 210 and 310 are bonded using a dielectric-to-dielectric bonding process, such as an oxide fusion bonding process.

The conductive feature 500 penetrates not only through the second semiconductor device 310, but also through the bonding layer 400. The conductive feature 500 can include aluminum or aluminum alloys. Alternatively, the conductive feature 500 may include copper or copper alloys, which have a resistance lower than that of aluminum. The conductive feature 500 can include a first block 502 having a uniform first critical dimension CD1, a second block 504 having a uniform second critical dimension CD2, and a third block 506 interposed between the first and second blocks 502 and 504 and having a varying third critical dimension CD3. The first critical dimension CD1 is less than the second critical dimension CD2; the third critical dimension CD3 gradually increases at positions of increasing distance from the first block 502, and gradually decreases at positions of increasing distance from the second block 504. In some embodiments, the first and second blocks 502 and 504 of the conductive feature 500 have rectangular shapes, and the third block 506 of the conductive feature 500 has a trapezoidal shape when viewed in a cross-sectional view. The first block 502, the second block 504 and the third block 506 of the conductive feature 500 can be integrally formed.

The first semiconductor device 210 includes a substrate 220, an insulative layer 240 encapsulating the substrate 220, and a conductive pad 250 surrounded by the insulative layer 240. The conductive pad 250 has a predetermined critical dimension CDa greater than the second critical dimension CD2 of the second block 504 of the conductive feature 500. After the assembling of the first and second semiconductor devices 210 and 310, the insulative layer 240 is in contact with the bonding layer 400.

The second semiconductor device 310 includes a substrate 322, a plurality of main components 330 disposed on or in the substrate 322, and an insulative layer 340 encapsulating the substrate 322 and the main components 330. After the assembling of the first and second semiconductor devices 210 and 310, the insulative layer 340 is in contact with the bonding layer 400. In some embodiments, the substrate 322 of the second semiconductor device 310 is capped with a passivation layer 452, wherein a portion of the second block 504 of the conductive feature 500, distal from the first block 502, is surrounded by the passivation layer 452.

As shown in FIG. 1, a portion of the first block 502 penetrates through the insulative layer 340 of the second semiconductor device 310 and the bonding layer 400, and another portion of the first block 502, having a first height H1, is in the substrate 322 of the second semiconductor device 310. In some embodiments, the first height H1 is greater than 1 μm. Additionally, the second block 504, in the substrate 322, has a second height H2 greater than the first height H1, and the third block 506 has a third height H3 less than the first height H1.

The semiconductor assembly 20 further includes an isolation liner 522 sandwiched between the second semiconductor device 310 and the conductive feature 500 to separate the conductive feature 500 from the second semiconductor device 310, thereby preventing the metal contained in the conductive feature 500 from diffusing into the substrate 322 of the second semiconductor device 310. In some embodiments, the isolation liner 522 may be further interposed between the bonding layer 400 and the conductive feature 500 and between the passivation layer 452 and the conductive feature 500.

The semiconductor assembly 20 may further include a diffusion barrier film 534 disposed between the conductive feature 500 and the isolation liner 522 and between the conductive pad 250 and the conductive feature 500. In other words, the conductive feature 500 is surrounded by the diffusion barrier film 534 having a substantially uniform thickness. The diffusion barrier film 534 includes refractory metals (such as tantalum and titanium). In some embodiments, the diffusion barrier film 534 functions as an adhesive layer to prevent the conductive feature 500 from flaking or spalling from the isolation layer 522. The conductive feature 500 and the diffusion barrier film 534 serve as an electrical interconnection between the conductive pad 250 and the bumps 102.

Generally, the main components 330 in the vicinity of the conductive feature 500 suffer serious performance degradation due to the stress induced by the conductive feature 500. To minimize such performance variation, a keep-out zone (KOZ), where no main components 330 can be placed, is imposed around the conductive feature 500. The larger the KOZ is, the lower the area utilization, for the fabrication of the main components 330, is. In order to increase the utilization of the substrate 322 of the second semiconductor device 320 through which the conductive feature 500 penetrates, the first block 502 of the conductive feature 500 in the vicinity of the main components 330 is designed to have the smallest critical dimension, while the second block 504 of the conductive feature 500 distal from the main components 330 can have a default critical dimension sufficient to facilitate the bonding of the bump 102.

Figure 2:
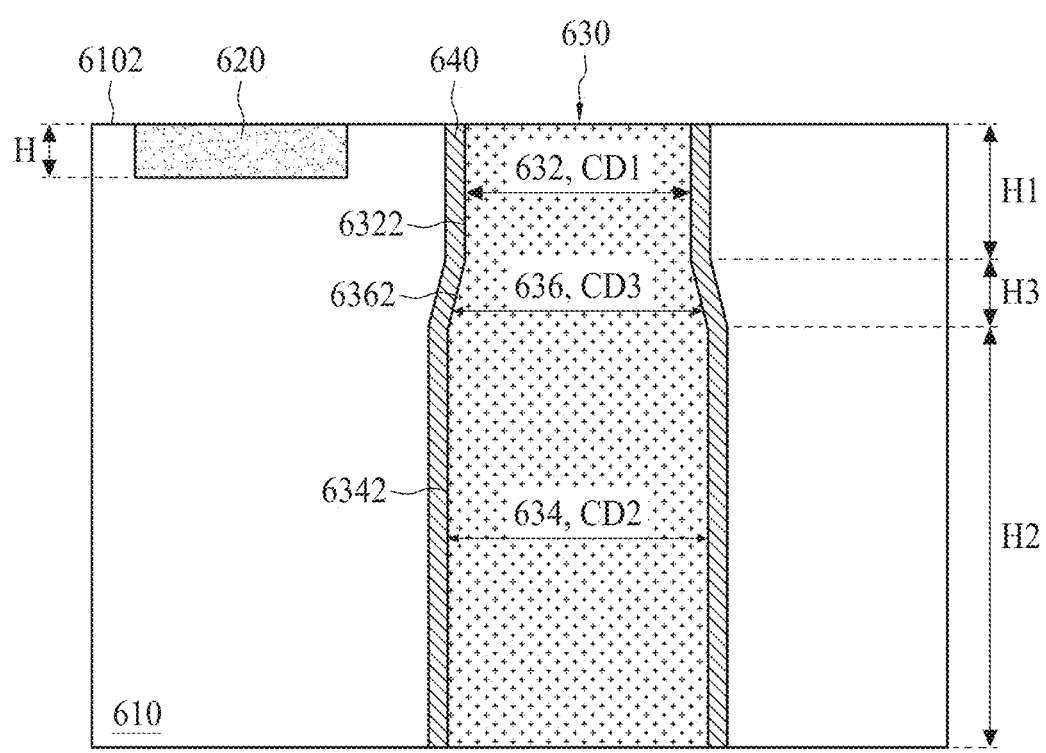
FIG. 2 is a cross-sectional view of a semiconductor device in accordance with some embodiments of the present disclosure.

FIG. 2 is a cross-sectional view of a semiconductor device 60 in accordance with some embodiments of the present disclosure. The semiconductor device 60 includes a substrate 610, and at least one component 620, a conductive feature 630, and an isolation liner 640 in the substrate 610. The substrate 610 is a semiconductor substrate, such as a bulk silicon substrate, although it may include other semiconductor materials such as group III, group IV, and/or group V elements. The main component 620, which may include a transistor, a capacitor, and the like, is formed in the substrate 610 and connected to a top surface 6102 of the substrate 610. In some embodiments, the main component 620 may include a recessed assess transistor, formed in the substrate 610 during front-end-of-line (FEOL) processes.

The conductive feature 630, penetrating through the substrate 610, includes a first block 632 having a uniform first critical dimension CD1, a second block 634 having a uniform second critical dimension CD2 different from the first critical dimension CD1, and a third block 636 having a varying third critical dimension CD3, wherein the third block 636 connects the second block 634 to the first block 632. In particular, the first critical dimension CD1 is less than the second critical dimension CD2, and the third critical dimension CD3 gradually increases at positions of increasing distance from the first block 632, and gradually decreases at positions of increasing distance from the second block 634. That is, the first and second blocks 632 and 634 have vertical peripheral surfaces 6322 and 6342, and the third block 636 has an inclined peripheral surface 6362.

In some embodiments, the first block 632 of the conductive feature 630 has a first height H1. In addition, the second block 634 of the conductive feature 630 has a second height H2 greater than the first height H1, and the third block 636 of the conductive feature 630 has a third height H3 less than the first height H1. In some embodiments, the main component 620 may have a default height H, which is less than the first height H1. For example, the first height H1 is greater than 1 μm. The conductive feature 630 having the non-uniform critical dimension may increase the utilization of the substrate 610. In some embodiments, the conductive feature 630 can be provided using a via last process.

The isolation liner 640 covers the peripheral surfaces 6322, 6342, 6362 of the conductive feature 630, thereby preventing the metal contained in the conductive feature 630 from diffusing into the substrate 610. The isolation liner 640 having a uniform thickness may include silicon-containing dielectric, such as silicon dioxide or silicon nitride, formed using a using a chemical vapor deposition (CVD) process or an atomic layer deposition (ALD) process, for example.

Figure 3:
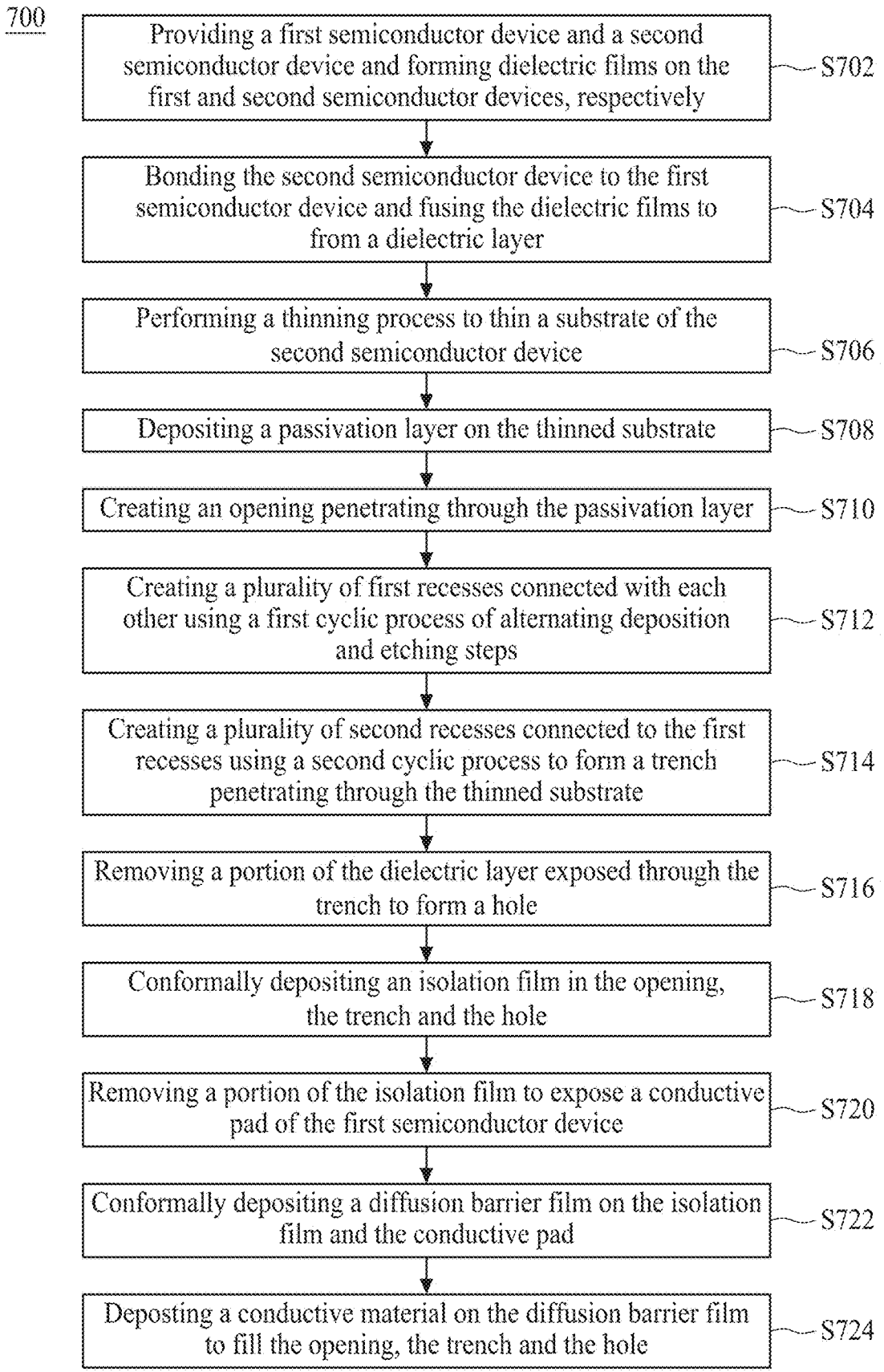
FIG. 3 is a flow diagram illustrating a method of manufacturing a semiconductor assembly in accordance with some embodiments of the present disclosure.

FIG. 3 is a flow diagram illustrating a method 700 of manufacturing a semiconductor assembly 20 in accordance with some embodiments of the present disclosure, and FIGS. 4 through 30 illustrate cross-sectional views of intermediate stages in the formation of the semiconductor assembly 20 in accordance with some embodiments of the present disclosure. The stages shown in FIGS. 4 to 30 are also illustrated schematically in the flow diagram in FIG. 3. In the following discussion, the fabrication stages shown in FIGS. 4 to 30 are discussed in reference to the process steps shown in FIG. 3.

Figure 4:
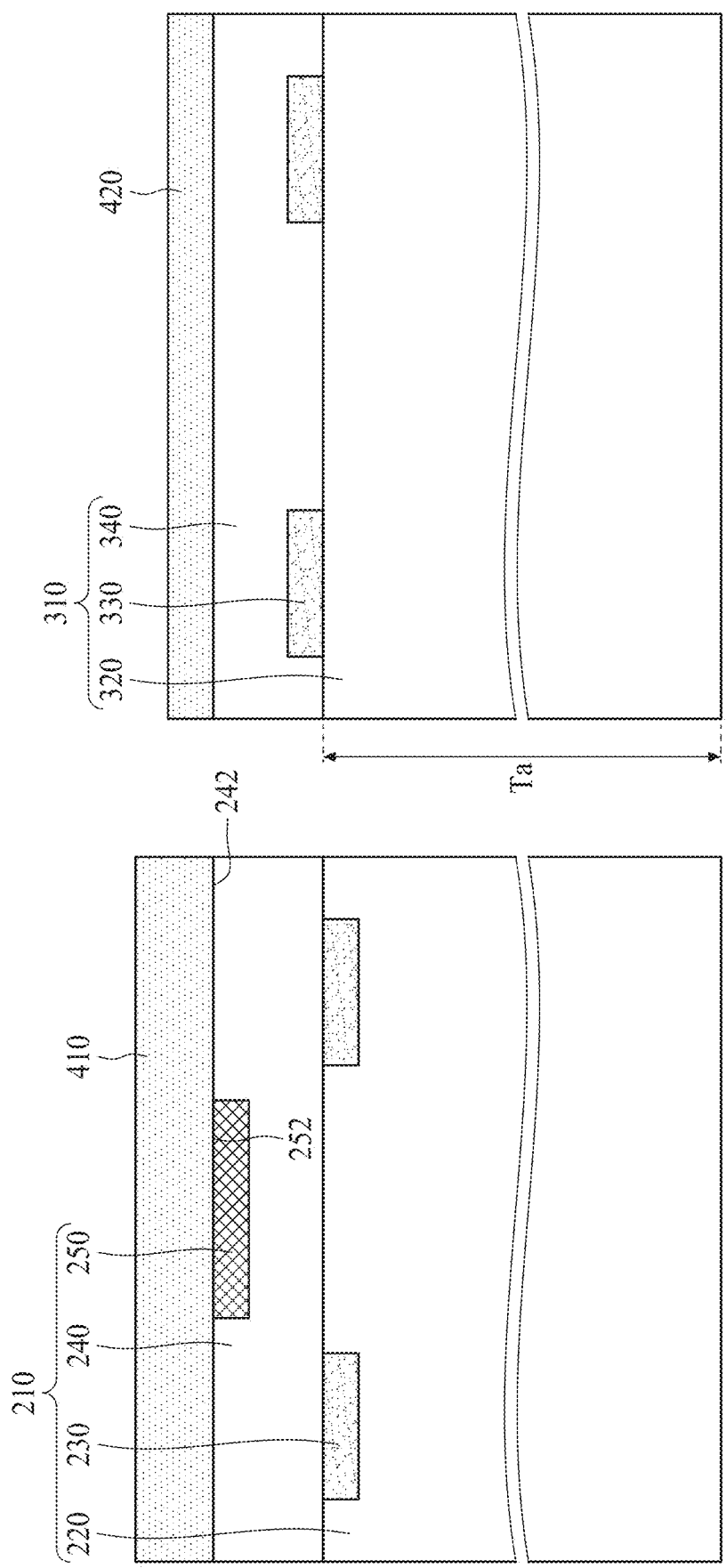
FIGS. 4 through 30 illustrate cross-sectional views of intermediate stages in the formation of a semiconductor assembly in accordance with some embodiments of the present disclosure.

Referring to FIG. 4, a first semiconductor device 210 and a second semiconductor device 310 are provided and dielectric films 410 and 420 are formed on the first and second semiconductor devices 210 and 310, respectively, according to a step S702 in FIG. 3. The first semiconductor device 210 includes a substrate 220, a plurality of main components 230 disposed in the substrate 220, an insulative layer 240 covering the substrate 220 and the main components 230, and a conductive pad 250 disposed in the insulative layer 240. The conductive pad 250 can have a topmost surface 252 coplanar with an upper surface 242 of the insulative layer 240, and the dielectric film 410 covers the insulative layer 240 and the conductive pad 250. The second semiconductor device 310 includes a substrate 320, a plurality of main components 330 disposed on or in the substrate 320, and an insulative layer 340 capping the substrate 320 and the main components 330. The dielectric films 410 and 420 are respectively formed by depositing a dielectric material, including oxide-based material, on the semiconductor devices 210 and 310 using a CVD process, for example.

The substrates 220 and 320 can be made of silicon. Alternatively or additionally, the substrates 220 and 320 may include other elementary semiconductor materials such as germanium. In some embodiments, the substrates 220 and 320 are made of a compound semiconductor such as silicon carbide, gallium arsenic, indium arsenide, or indium phosphide. In some embodiments, the substrates 220 and 320 are made of an alloy semiconductor such as silicon germanium, silicon germanium carbide, gallium arsenic phosphide, or gallium indium phosphide. The substrates 220 and 320 may be formed with various doped regions (not shown) doped with p-type dopants, such as boron, and/or n-type dopants, such as phosphorus or arsenic. In some embodiments, isolation features, such as shallow trench isolation (STI) features or local oxidation of silicon (LOCOS) features, can be introduced in the substrates 220/320 to define and isolate various main components 230/330 in or on the substrates 220/320.

The main components 230 and 330 may include active components, such as transistors and/or diodes, and passive components, such as capacitors, resistors or the like. The main components 230 and 330 are formed using various processes including deposition, etching, implantation, photolithography, annealing, and/or other applicable processes. The main components 230 can be electrically connected to the conductive pad 250 through conductive features (not shown) buried in the insulative layer 240 and formed using the well-known damascene processes. In addition, the main components 230/330 may interconnect with one another to form, for example, a logic device, a memory device, an input/output device, a system-on-chip device, another suitable type of device, or a combination thereof. In some embodiments, the main components 230 and 330 may be respectively formed in the substrates 220 and 320 during front-end-of-line (FEOL) processes. The insulative layers 240/340 and the conductive pad 250 may be formed over the substrates 220/320 during back-end-of-line (BEOL) process.

Figure 5:
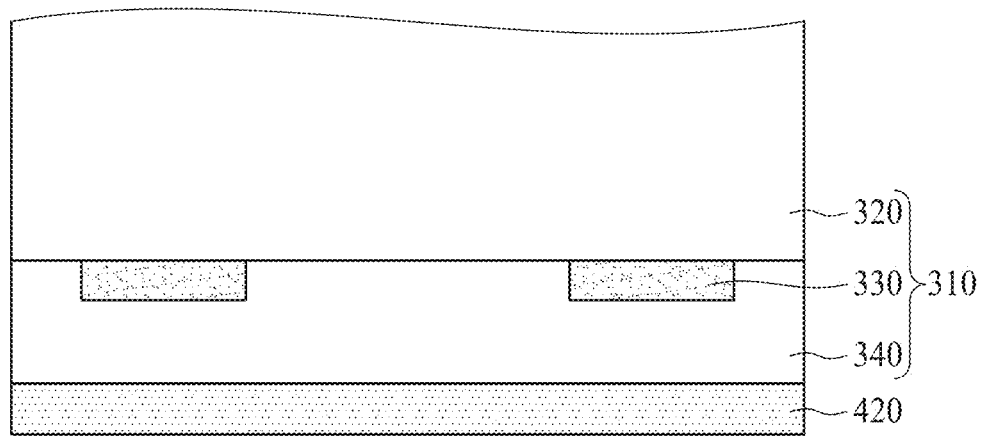
Figure 5:
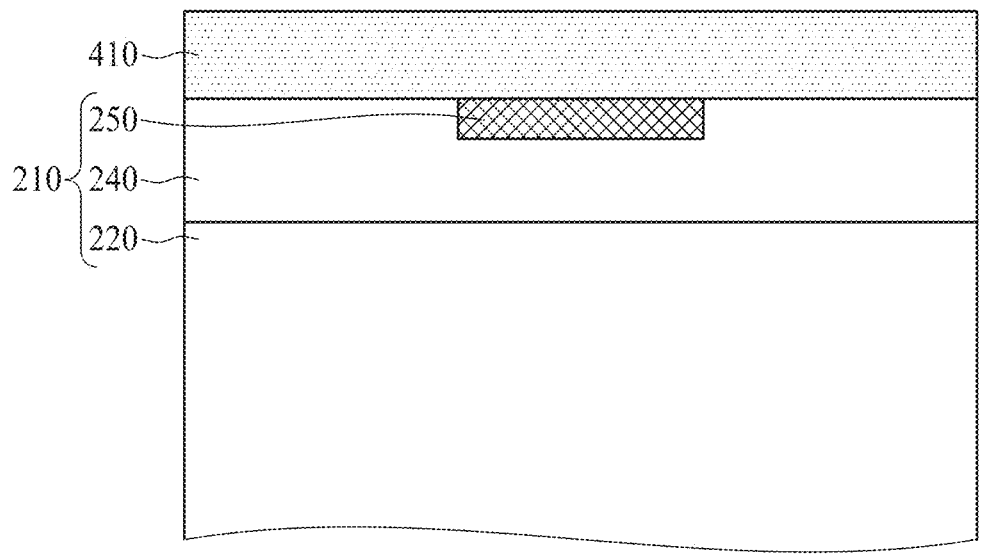

Referring to FIG. 5, the second semiconductor device 310 is flipped upside down, such that the dielectric films 410 and 420 can face and be aligned with one another. In some embodiments, planarizing processes can be optionally performed on the dielectric films 410 and 420 prior to the alignment of the first and second semiconductor devices 210 and 310 to yield an acceptably flat topology.

Figure 6:
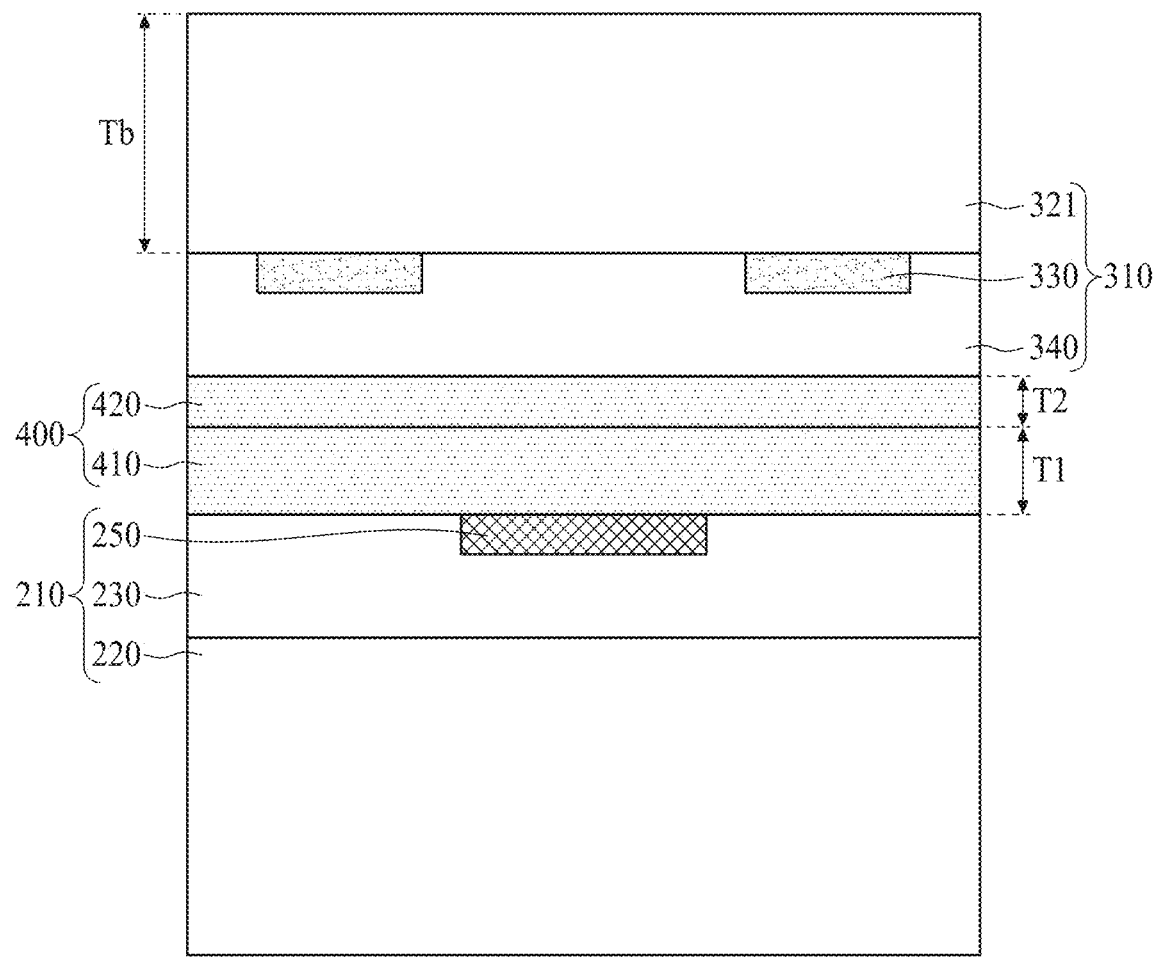

Referring to FIG. 6, the first and second semiconductor devices 210 and 310 are bonded according to a step S704 in FIG. 3. After the bonding of the second semiconductor device 310 to the first semiconductor device 210, the dielectric film 410 of the first semiconductor device 210 is in direct contact with the dielectric film 420 capping the second semiconductor device 310. After surfaces of the dielectric films 410 and 420 are brought into contact, heat and force are applied to fuse the dielectric films 410 and 420, thus forming a bonding layer 400. In some embodiments, a strength of the fusion bonding between the dielectric films 410 and 420 may be increased by exposing the first and second semiconductor devices 210 and 310 coated with the dielectric films 410 and 420, respectively, to an anneal process. In addition, the dielectric film 410 coated on the first semiconductor device 210 has a first thickness T1, and the dielectric film 420 covering the second semiconductor device 310 has a second thickness T2; the first thickness T1 is greater than the second thickness T2, thereby mitigating stress applied to the first semiconductor device 210 during the fusing of the dielectric films 410 and 420.

Subsequently, a thinning process is performed on the substrate 320 of the second semiconductor device 310 to decrease a thickness thereof according to a step S706 in FIG. 3. The substrate 320 is thinned from an original thickness Ta, shown in FIG. 4, to a thickness Tb, about 30 to 50 micrometers. The original thickness Ta of the substrate 320 is, for example, about 775 micrometers. The substrate 320 is thinned to reduce processing time for forming at least one conductive feature as described below. The thinning process can be implemented using suitable techniques such as grinding, polishing and/or chemical etching. In some embodiments, a carrier wafer (not shown) may be provided to support the bonded first and second semiconductor device 210 and 310 during the thinning of the substrate 320. The carrier wafer can be a blank glass carrier, a blank ceramic carrier, or the like, and may be reusable such that it can be used again after removal. That is, the carrier wafer can be used again; for example, the carrier wafer can repeatedly implement the step S706 to manufacture intermediate structures.

Figure 7:
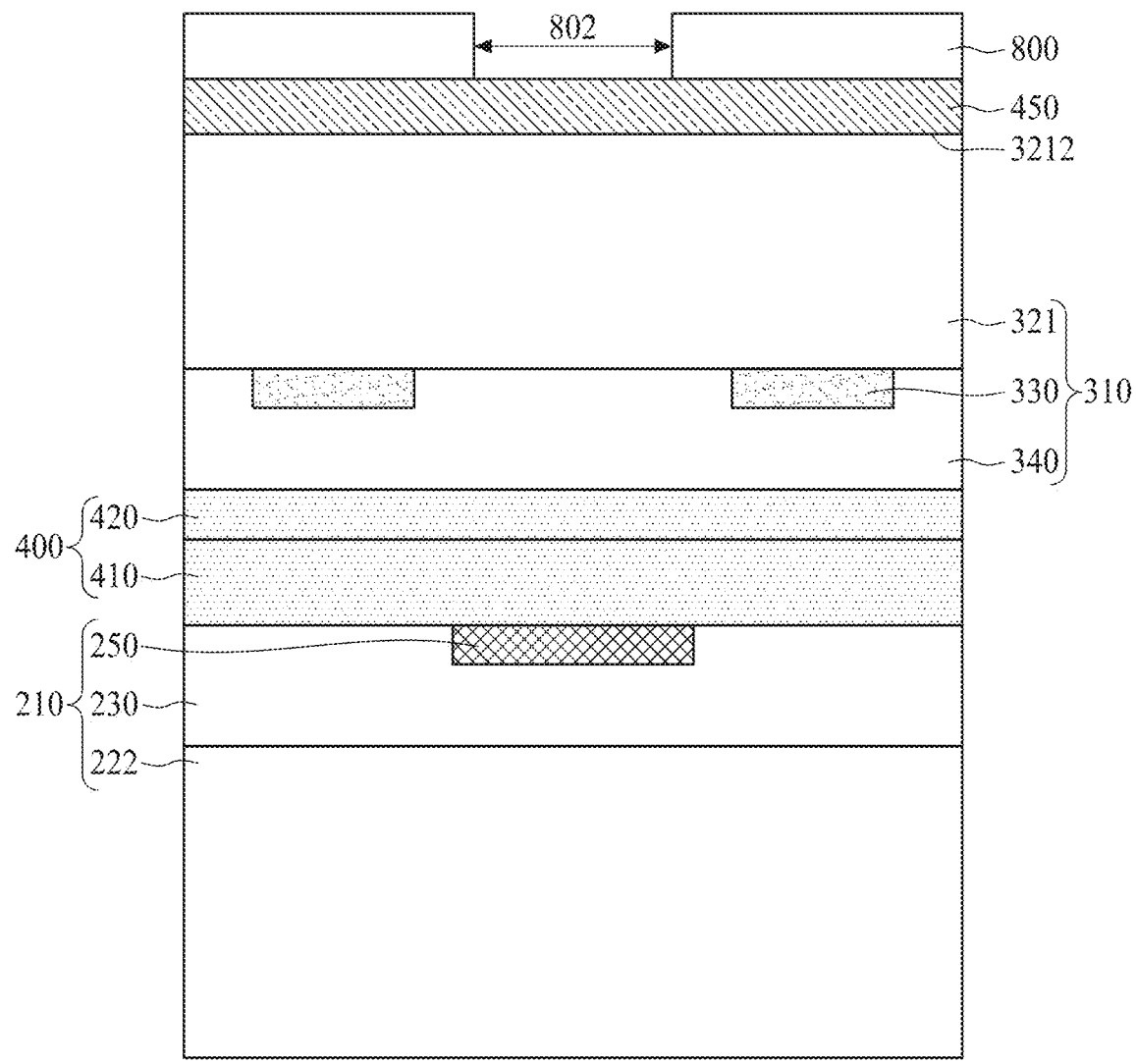

Referring to FIG. 7, a passivation layer 450 is formed to cap the thinned substrate 321 according to a step S708 in FIG. 3. The passivation layer 450, having a uniform thickness, can be formed by depositing a dielectric material on a surface 3212 of the thinned substrate 321. The passivation layer 450, including silicon-containing materials such as silicon dioxide or silicon nitride, may be formed using a spin-coating process, a CVD process, or another suitable process that can form the dielectric material. In some embodiments, a planarizing process can be optionally performed after the deposition of the dielectric material to yield an acceptably flat topology.

After the formation of the passivation layer 450, a photoresist mask 800, including at least one window 802, is provided on the passivation layer 450. The photoresist mask 800 is formed by steps including (1) conformally coating a photosensitive material on the passivation layer 450, (2) exposing portions of the photosensitive material to radiation (not shown), (3) performing a post-exposure baking process, and (4) developing the photosensitive material, thereby forming the window 802 defining the pattern to be etched through the passivation layer 450.

Figure 8:
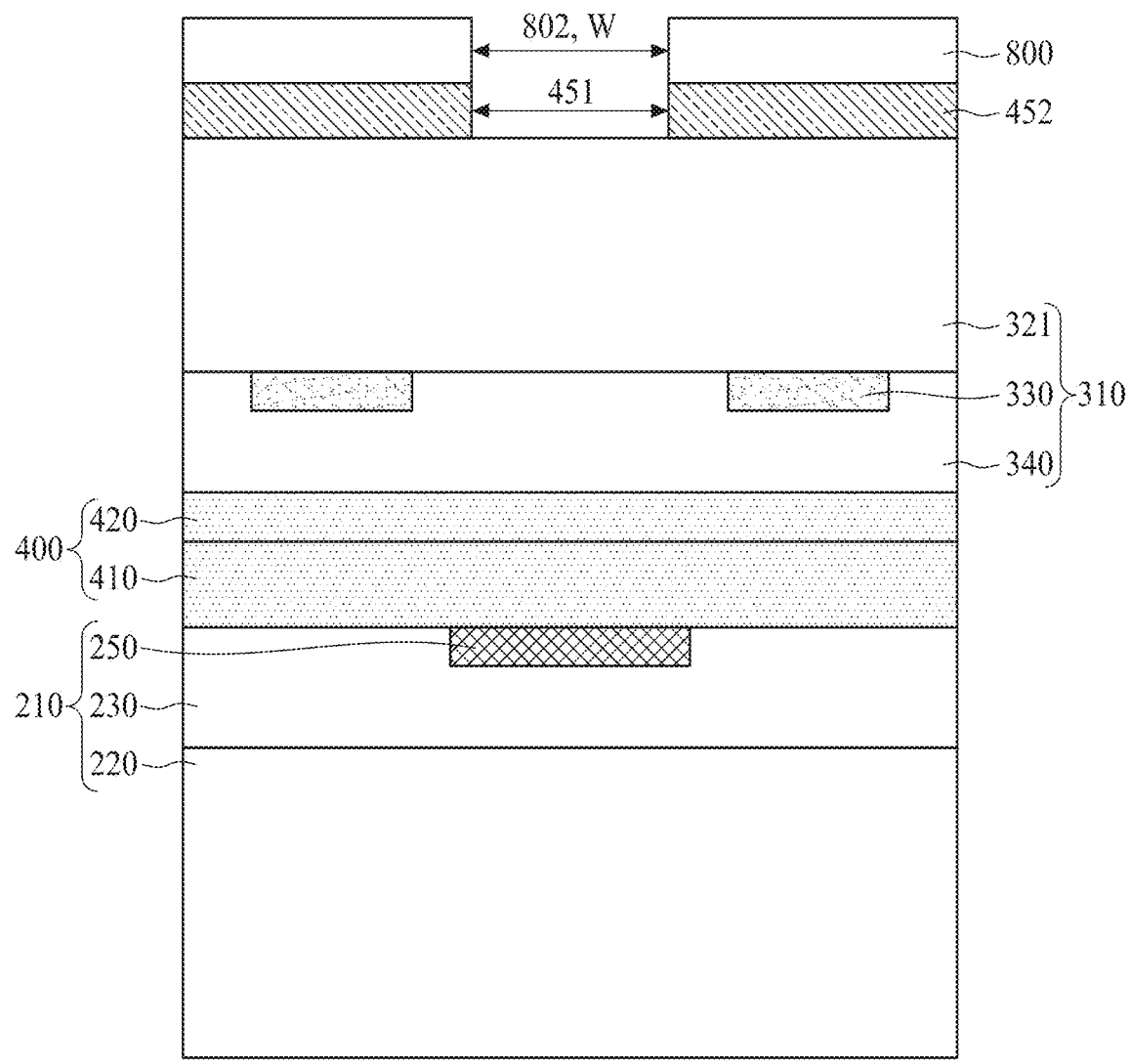

Referring to FIGS. 7 and 8, the passivation layer 450 is etched through the window 802 to form an opening 451 exposing a portion of the thinned substrate 321 according to a step S710 in FIG. 3. Accordingly, a remaining passivation layer 452 exposing a portion of the thinned substrate 321 over the conductive pad 250 is formed. The passivation layer 450 can be anisotropically dry-etched, using a reactive ion etching (RIE) process, for example, through the window 802 to create the opening 451, so that a default width W in the window 802 is maintained in the opening 451.

Subsequently, the thinned substrate 321 is etched utilizing cyclic processes to create a trench 300 having a non-uniform width. In particular, a portion of the thinned substrate 321 is removed utilizing a first cyclic process of alternating deposition step and etching step (step S712 in FIG. 3), and a portion of the thinned substrate 321 is removed utilizing a second cyclic process including an alternating sequence of deposition step, deposition step and etching step (step S714 in FIG. 3). Collectively the steps S712 and S714 of FIG. 3 result in the deep, high aspect ratio trench 300 penetrating through the thinned substrate 321.

Figure 9:
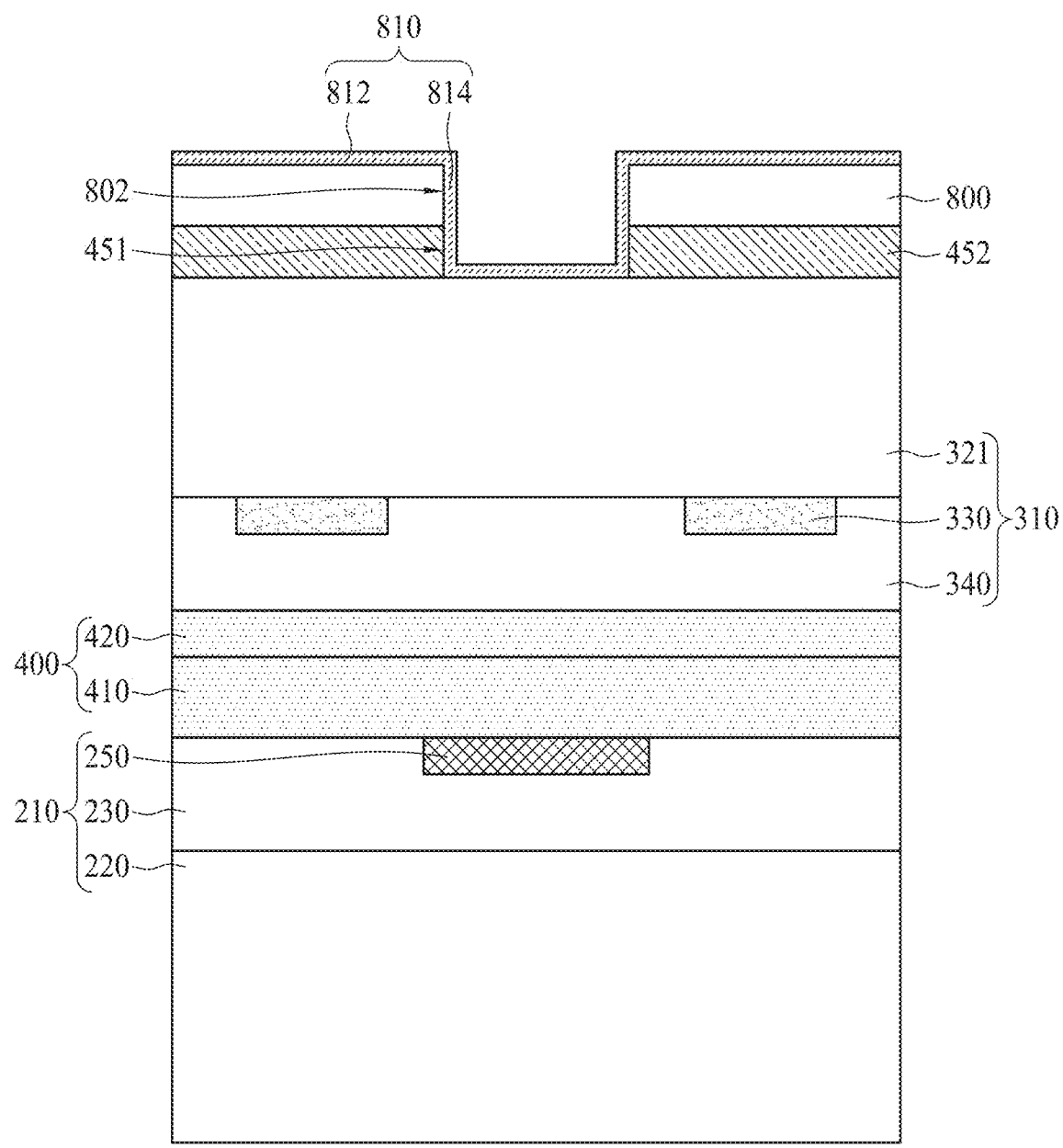

The first cyclic process is illustrated starting in FIG. 9. As shown in FIG. 9, a sacrificial film 810 is formed on the photoresist mask 800 and in the opening 451 and the window 802 to cover the thinned substrate 321, the passivation layer 452 and the photoresist mask 800. The sacrificial film 810 may have a topology following the topology of the exposed portions of the thinned substrate 321, the passivation layer 452 and the photoresist mask 800. As shown in FIG. 9, the sacrificial film 810 may include horizontal portions 812 capping the thinned substrate 321 and the photoresist mask 800, and one or more vertical portions 814 coated on portions of the passivation layer 452 exposed by the opening 451 and portions of the photoresist mask 800 exposed by the window 802. The sacrificial film 810 can be deposited using a plasma deposition process that uses a gas selected from the group consisting of trifluoromethane ($CHF_3$), tetrafluoroethane ($C_2F_4$), hexafluoroethane ($C_2F_6$), difluoroethane ($C_2H_2F_2$), octofluorocyclobutane ($C_4F_8$) and mixtures thereof.

Figure 10:
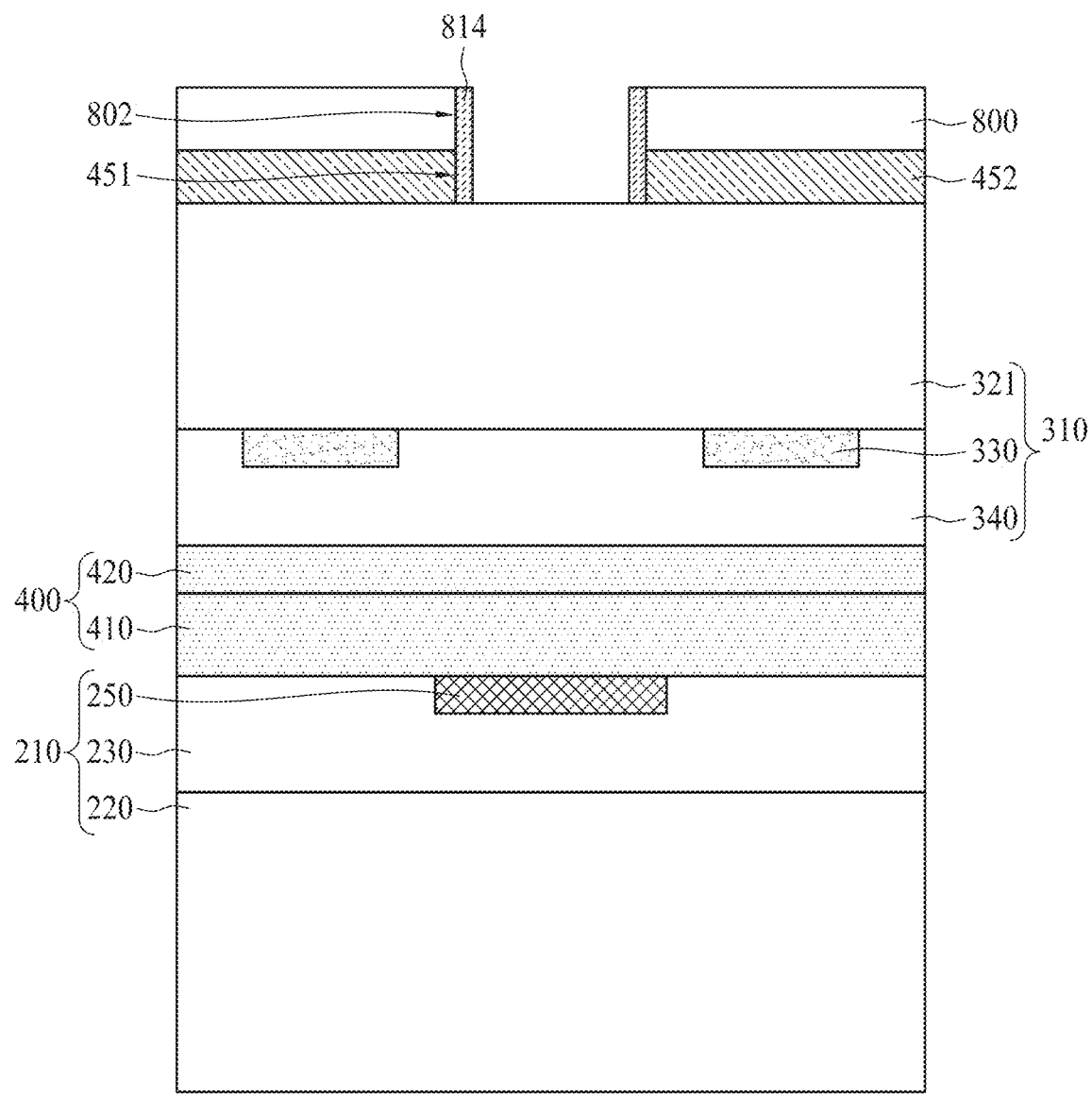
Figure 11:
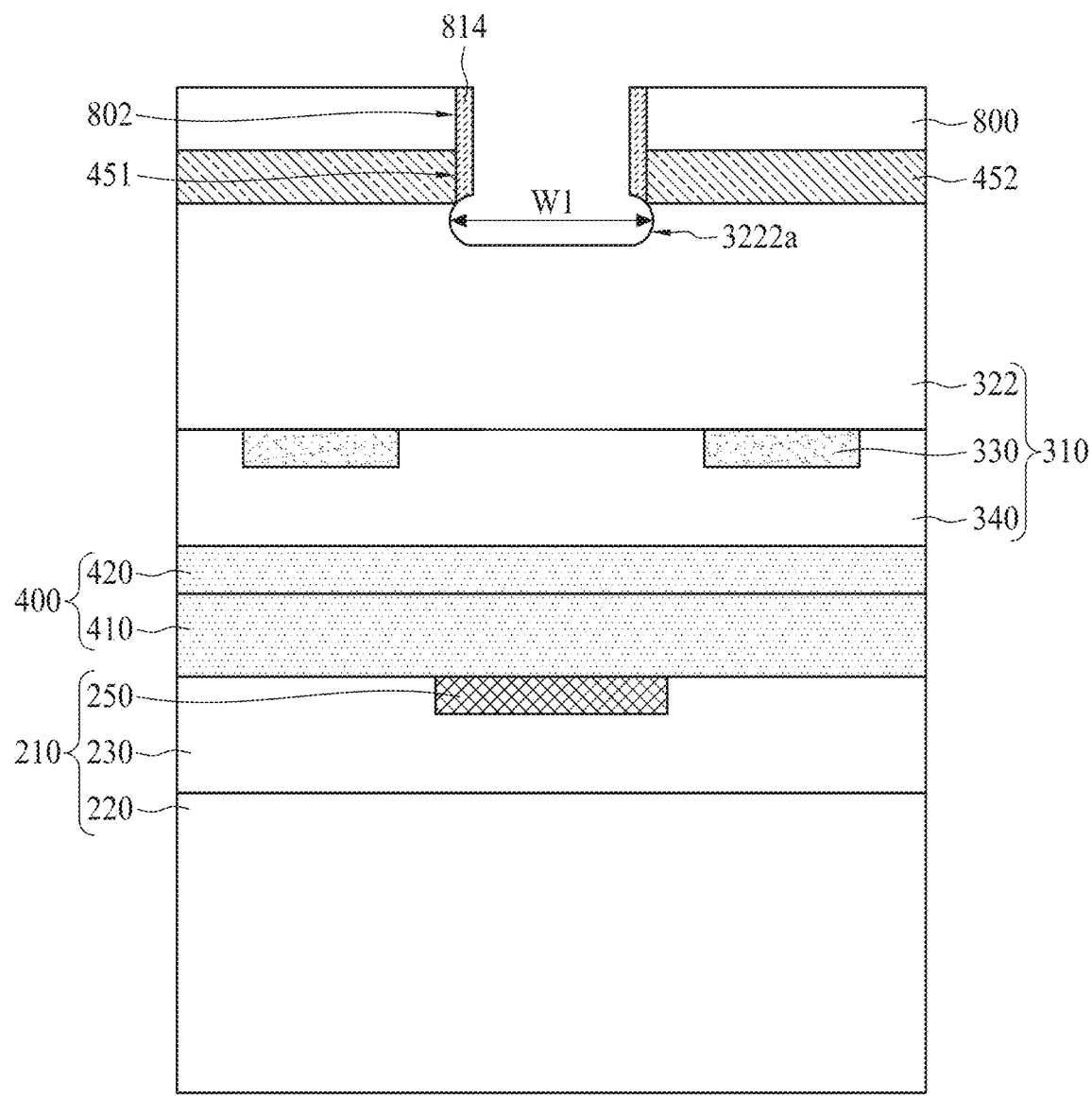

Subsequently, an etching step is conducted to at least remove portions of the sacrificial film 810 in contact with the thinned substrate 321 (as shown in FIG. 10) and a portion of the thinned substrate 321 exposed to the residual sacrificial spacer (as shown in FIG. 11). Accordingly, a first recess 3222a is created. The etching step is a plasma etching step in which ions, preferably being accelerated, are advanced toward the stacked first and second semiconductor devices 210 and 310, and thus make available the activation energy required for the chemical reaction of the etching step. In particular, the required plasma is generated from an etching gas by high-frequency discharge or a microwave discharge, wherein the etching gas is derived from fluorine compounds such as sulfur hexafluoride ($SF_6$), tetrafluoromethane ($CF_4$) and trifluoroamine ($NF_3$).

Notably, the etching of the portions of the sacrificial film 810 and the thinned substrate 321 is performed in-situ during the formation of the sacrificial film 810. As used herein, the term "in-situ" is used to describe steps or processes that are performed while the bonded first and second semiconductor devices 210 and 310 remain within a processing system (e.g., a system including a load lock chamber, transfer chamber, processing chamber, or any other fluidly-coupled chamber), and where, for example, the processing chamber allows the bonded first and second semiconductor devices 210 and 310 to remain under vacuum conditions. As such, the term "in-situ" may also generally be used to refer to steps or processes in which the bonded first and second semiconductor devices 210 and 310 being processed are not exposed to an external ambient (e.g., external to the processing system) environment. In some embodiments, the process chamber can be, for example, a reactive etch chamber configured to generate a plasma by coupling a radio frequency (RF) electromagnetic field to a gas therein.

Referring again to FIGS. 9 and 10, because the fluorine-based gas that is employed to dry-etch the silicon-containing substrate 321 is a less-effective etchant of the sacrificial film 810, the sacrificial film 810 can be anisotropically etched. Accordingly, the horizontal portions 812 of the sacrificial film 810 are removed, while the vertical portions 814 of the sacrificial film 810 are left on sidewalls of the passivation layer 452 and the photoresist mask 800.

Referring again to FIGS. 10 and 11, the thinned substrate 321 is etched using the residual sacrificial spacer (i.e., the vertical portions 814 of the sacrificial film 810) as a mask. Because of statistical distribution of velocity of the radicals in the plasma and the associated efficacy for forming volatile adsorbates, a lateral etching accompanies a vertical etching of the semiconductor material in the thinned substrate 321, causing one or more undercuts to be formed in the etched substrate 322. Accordingly, the first recess 3222a can have a first width W1 greater than the default width W in the window 802 of the photoresist mask 800 shown in FIG. 8.

Figure 12:
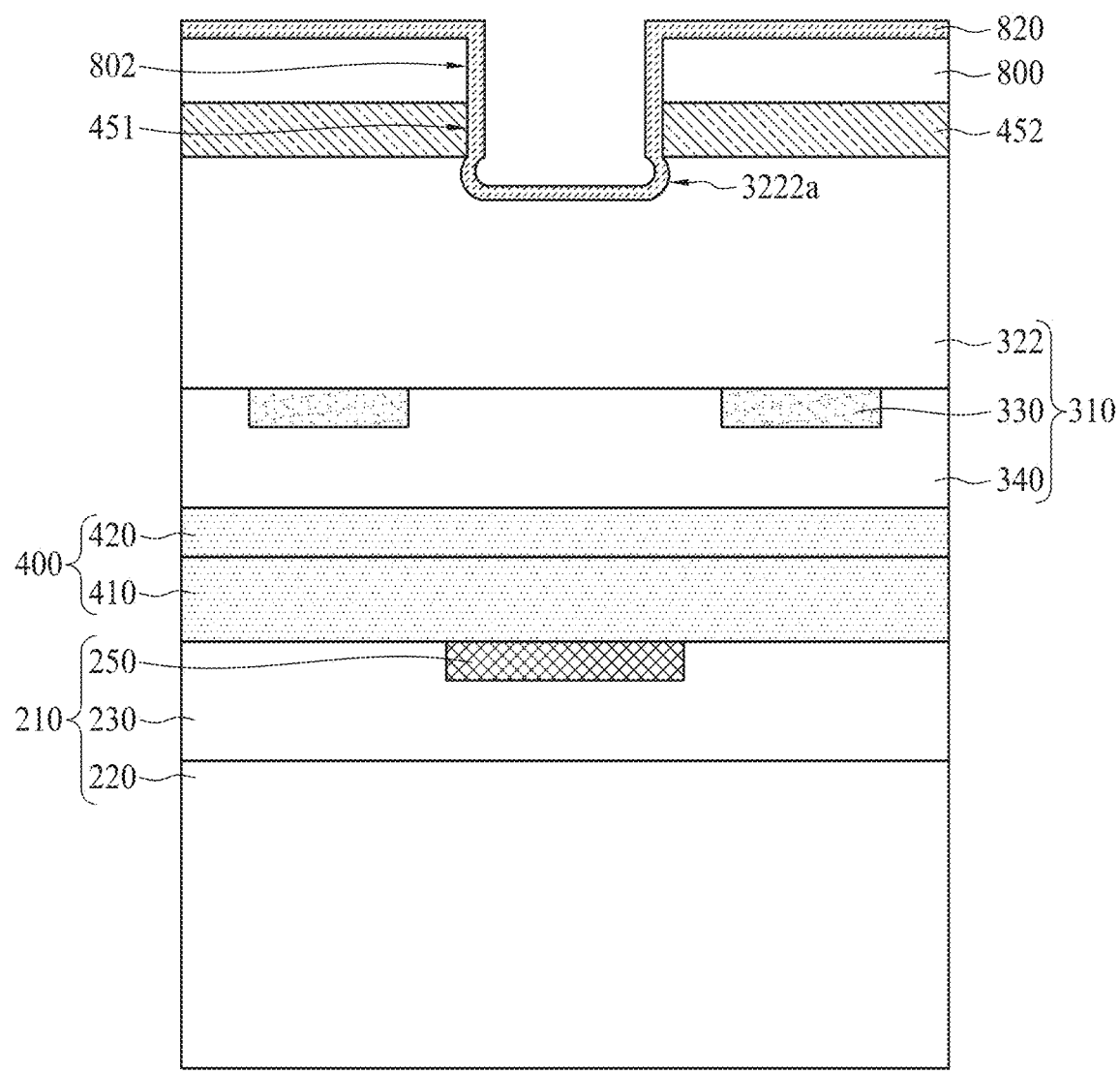

Once the etching step of FIGS. 10 and 11 is completed, the etching gas in the process chamber is pumped out of the process chamber, and the deposition gas flows into the process chamber to form another sacrificial film 820, as shown in FIG. 12. The deposition is ionized to form ions; the ions are accelerated toward the stacked first and second semiconductor devices 210 and 310 to deposit the sacrificial film 820 on the photoresist mask 800, the residual sacrificial spacer, and a portion of the substrate 322 exposed by the first recess 3222a. Because of statistical distribution of velocity of the radicals in the plasma, the sacrificial film 820 is a contiguous film.

Figure 13:
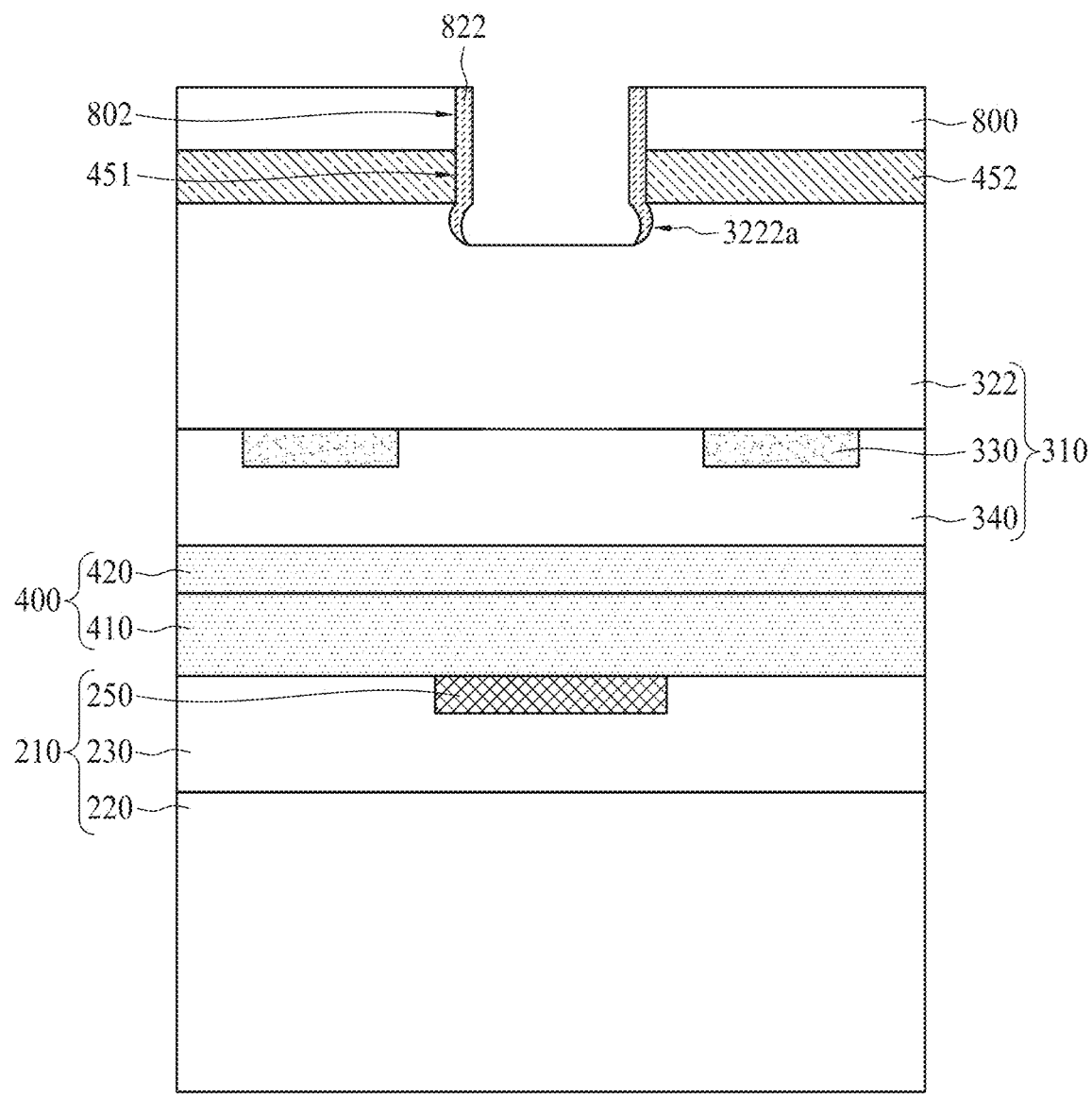
Figure 14:
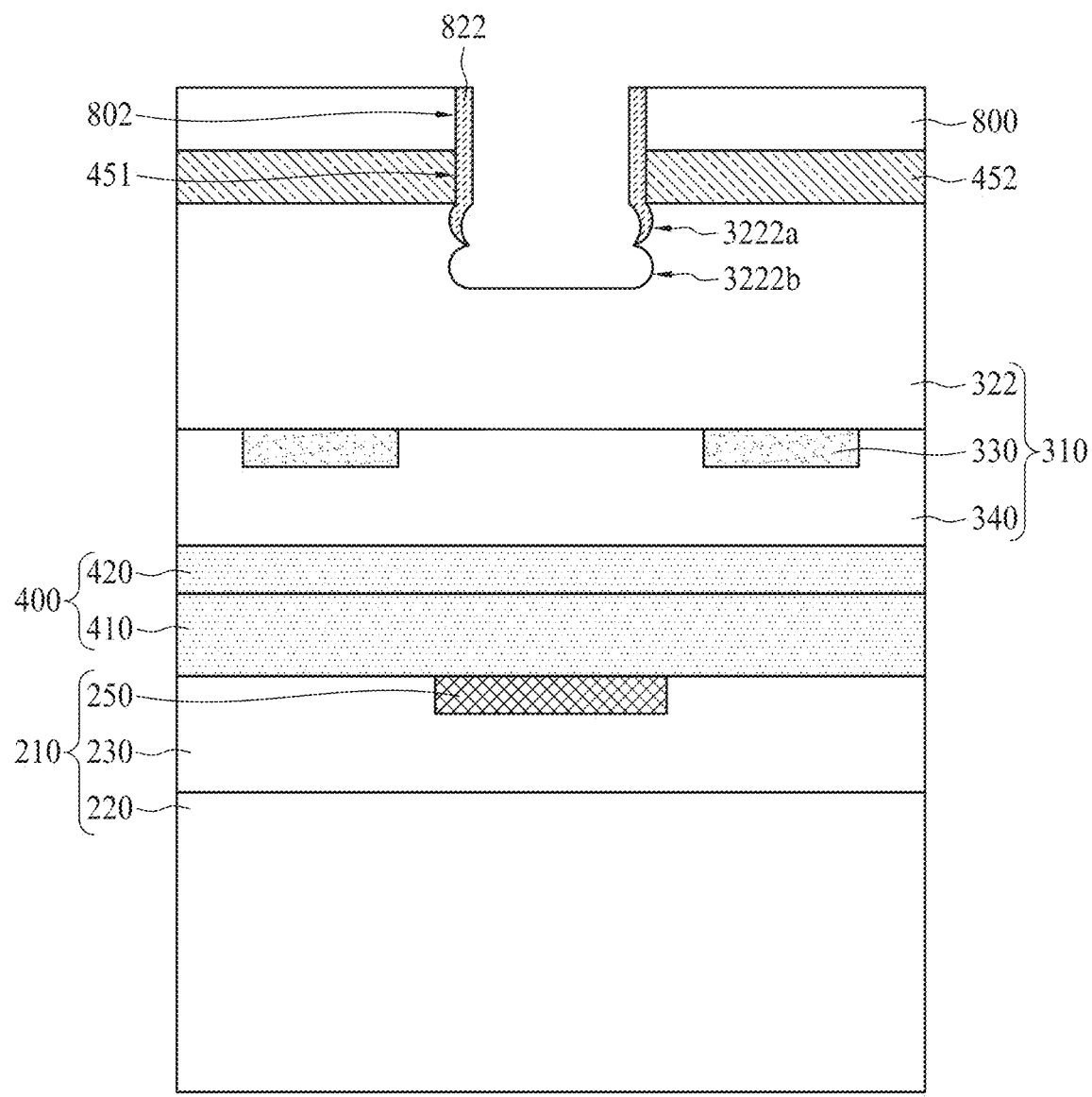

Referring to FIGS. 13 and 14, after the deposition of the sacrificial film 820, the etching step of FIGS. 10 and 11 is conducted again. The time duration of such etching step used for etching portions of the sacrificial film 820 and the substrate 322 can be the same as that for etching the portions of the sacrificial film 810 and the thinned substrate 321 shown in FIGS. 10 and 11. More particularly, in FIG. 13, the sacrificial film 820, shown in FIG. 12, is etched anisotropically such that a portion of the substrate 322 is exposed. Subsequently, in FIG. 14, the substrate 322 is etched, through the residual sacrificial film 822, to create another first recess 3222b in communication with the first recess 3222a, in the substrate 322.

Figure 15:
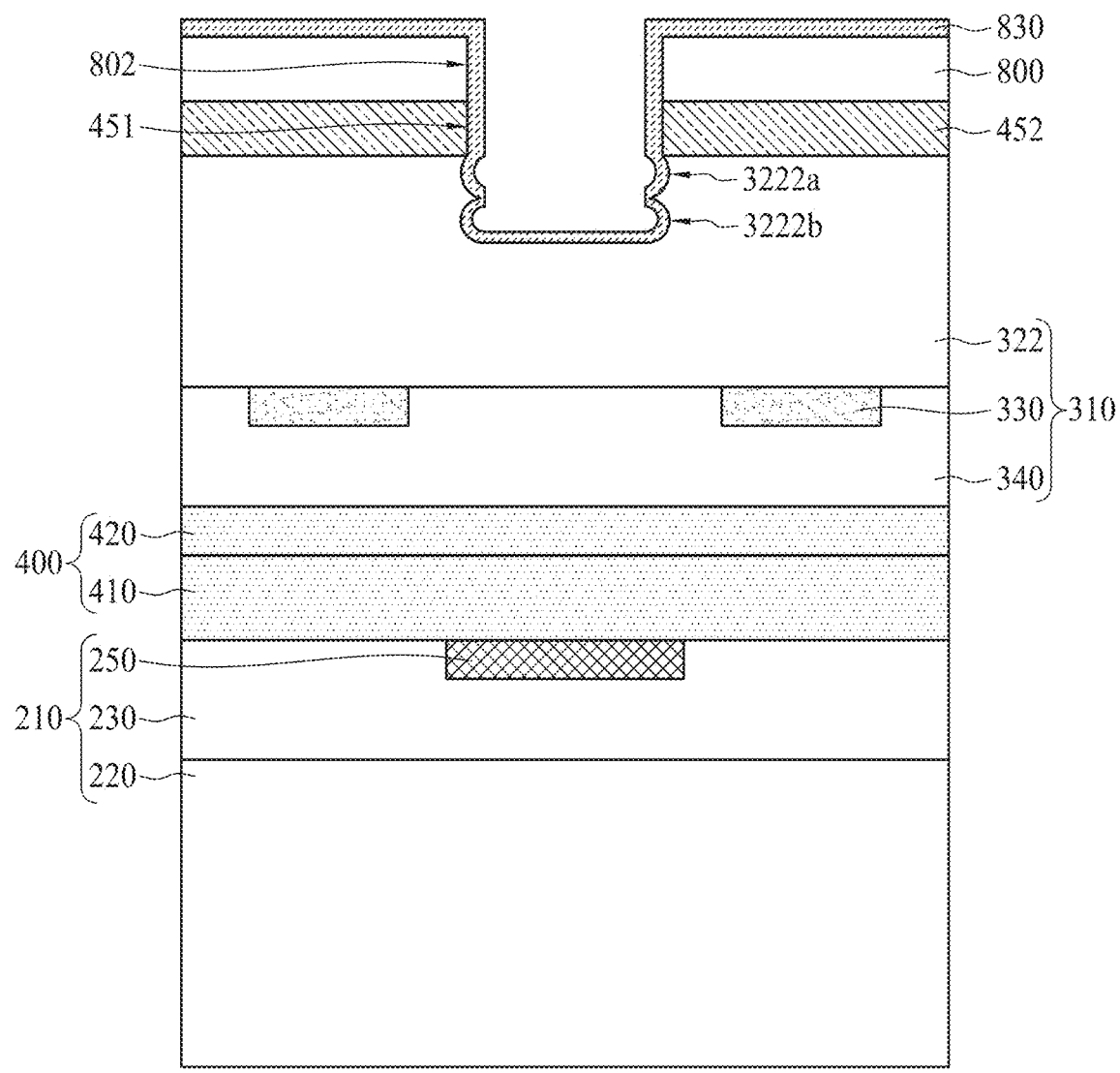

After the formation of the first recess 3222b, the deposition process of FIG. 12 can be repeated to cap a portion of the substrate 322 exposed by the first recess 3222b by a sacrificial film 830, as shown in FIG. 15. The process parameters of the deposition of the sacrificial film 830 can be substantially the same as the process parameters for depositing the sacrificial film 820, as shown in FIG. 12.

Figure 16:
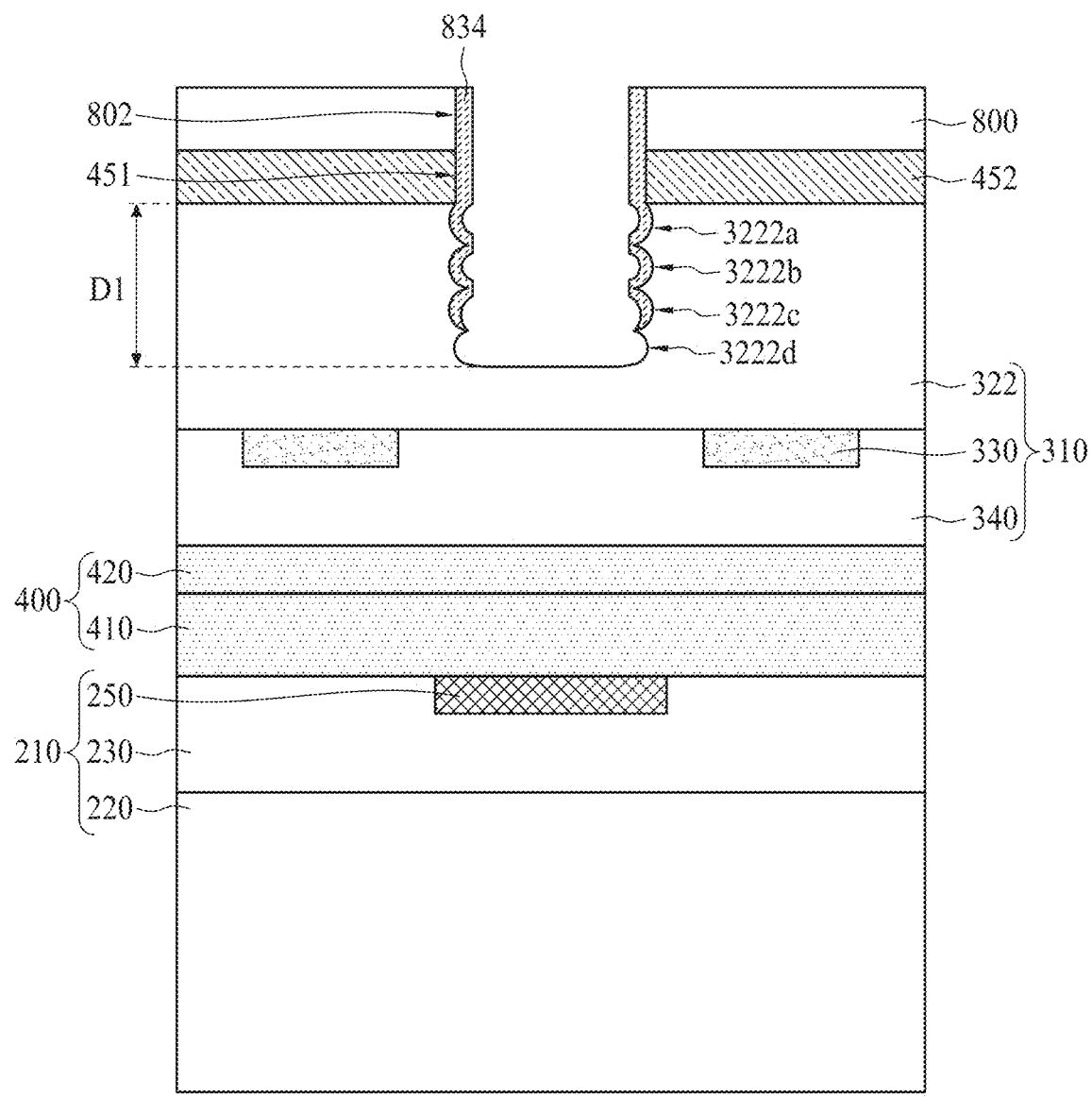

A sequence of the etching step and deposition step in the first cyclic process is repeated on the stack of the first and second semiconductor devices 210 and 310 until the substrate 322 is etched to a selected depth D1, as shown in FIG. 16. Each repetition of the sequence of the etching step and the deposition step extends the trench downward to increase a cavity volume. In some embodiments, the first cyclic process may create four first recesses 3222a to 3222d.

After the first cyclic process is completed, the second cyclic process is performed to extend the trench to penetrate through the substrate 322. The second cyclic process includes a sequence of a first deposition step, a second deposition step and an etching step.

Figure 17:
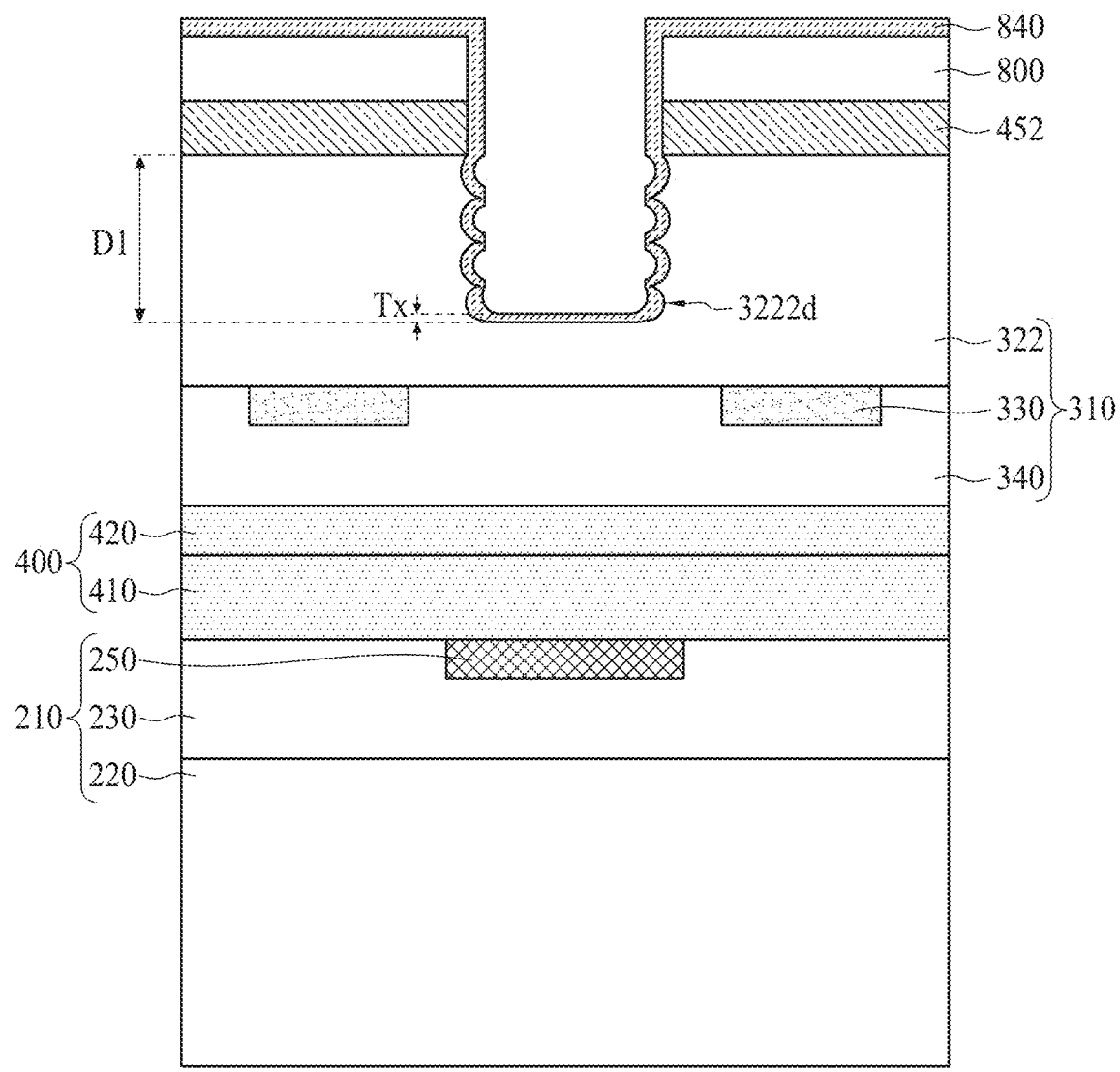

The second cyclic process is illustrated started in FIG. 17. As shown in FIG. 17, a first deposition step is conducted to form a first sacrificial film 840 to at least cap a portion of the substrate 322 exposed by the first to fourth recesses 3222a to 3222d. The sacrificial film 840 at the bottom of the fourth recess 3222d and in contact with the substrate 322 may have a thickness Tx. Notably, the process parameters of the deposition of the sacrificial film 840 can be substantially the same as the process parameters for depositing the sacrificial films 810/820.

Figure 18:
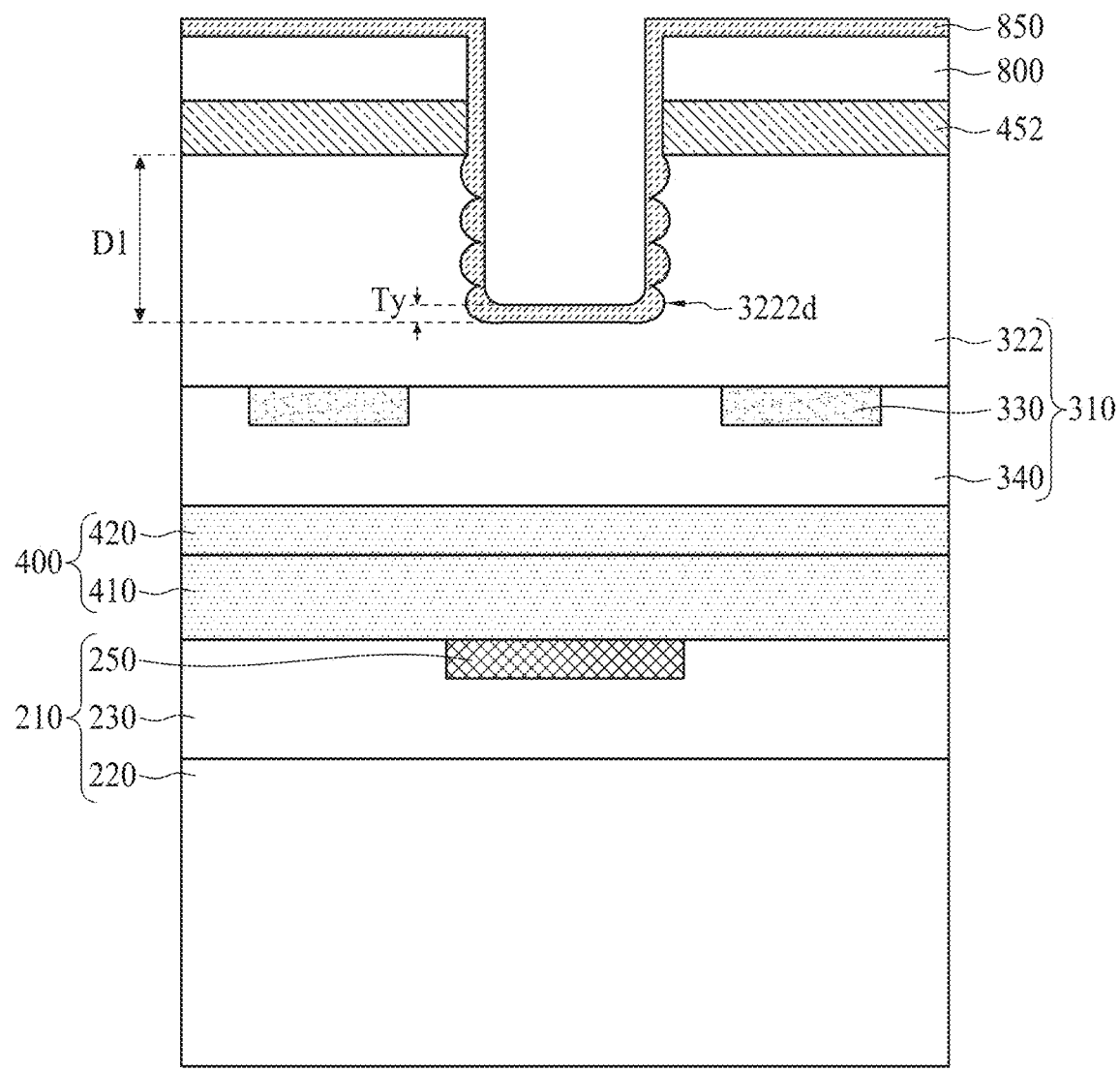

Referring to FIG. 18, a second deposition step is conducted to grow the sacrificial film 840 shown in FIG. 17 from the thickness Tx to a desired thickness Ty, thereby forming another sacrificial film 850. The time duration of the second deposition step can be the same as or different from that of first cyclic process.

Figure 19:
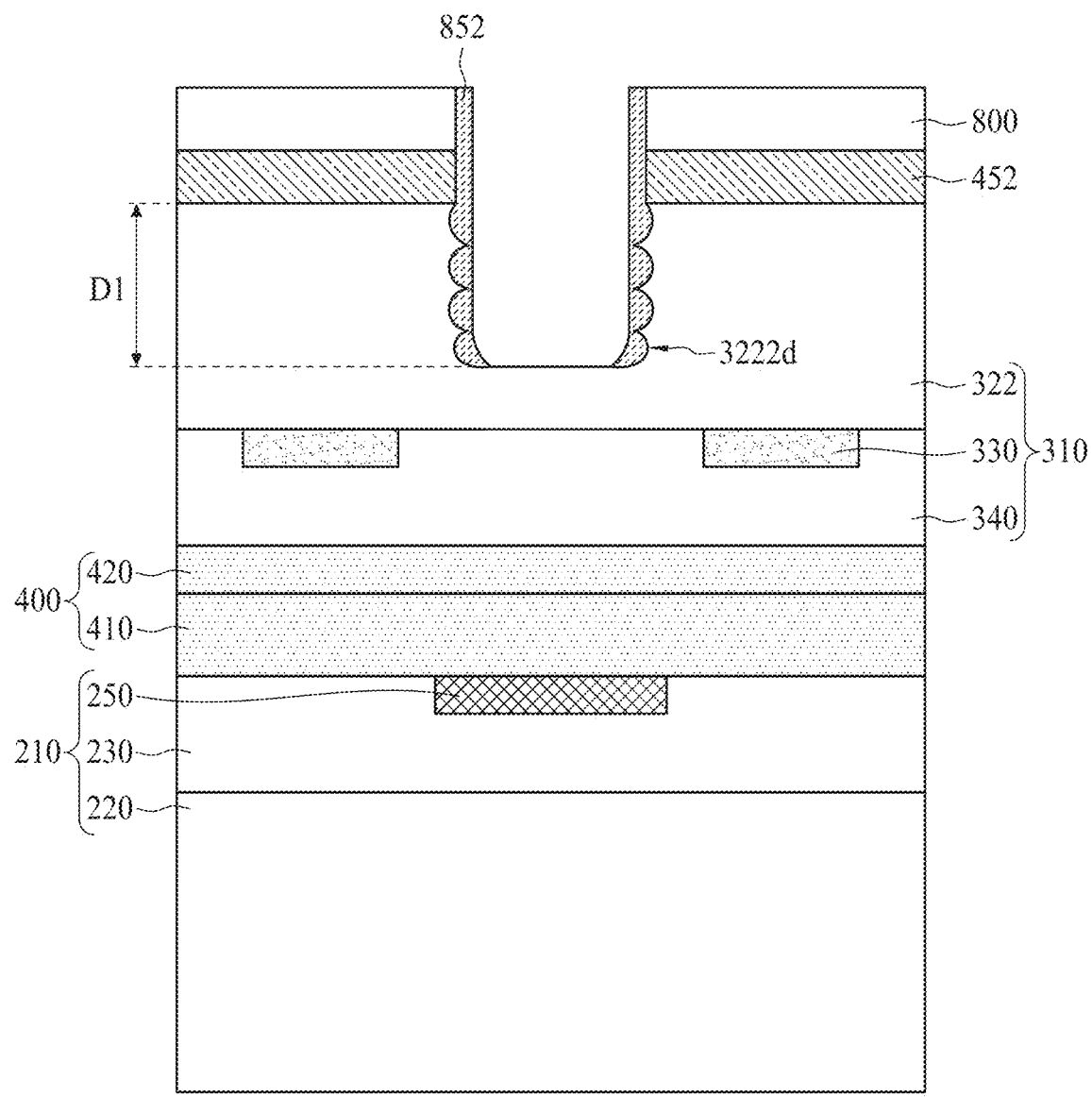
Figure 20:
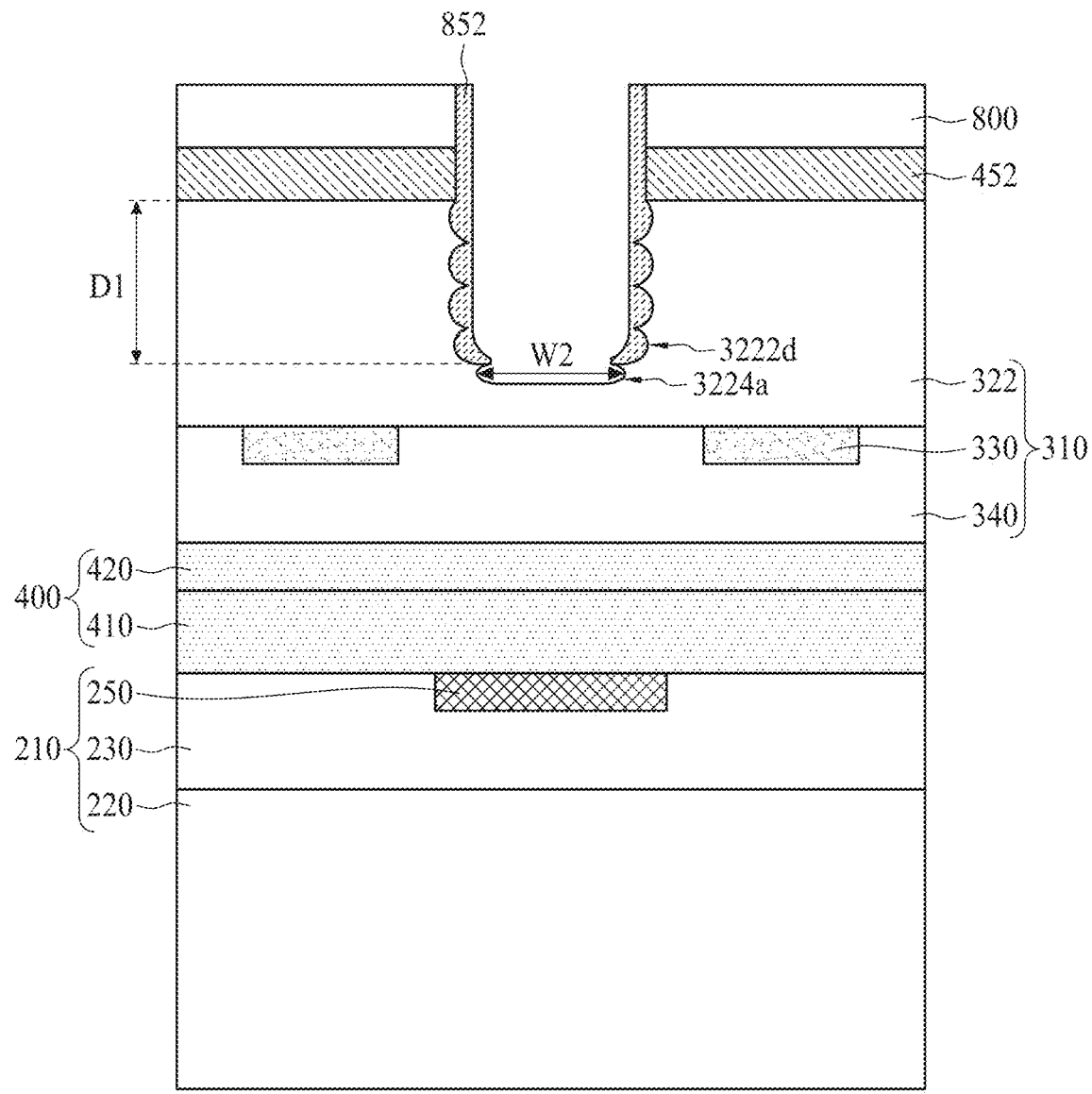

After the second deposition step is completed, an etching step is conducted to etch portions of the sacrificial film 850 (as shown in FIG. 19) and etch portions of the substrate 322 exposed by the residual sacrificial film 852 (as shown in FIG. 20). Accordingly, a second recess 3224a is created. The second recess 3224a can have a second width W2 less than the first width W1 of the first recess 3222a (as shown in FIG. 11). Notably, the time duration of the etching step in the second cyclic process for etching the substrate 322 is less than the time duration of the etching step in the first cyclic process for etching the substrate 321/322. Additionally, the time duration of the etching process in the second cyclic process for etching portions of the sacrificial film 850 and the substrate 322 may be the same as the time duration of the etching process in the first cyclic process for etching the sacrificial film 810/820/830 and the substrate 321/322.

Figure 21:
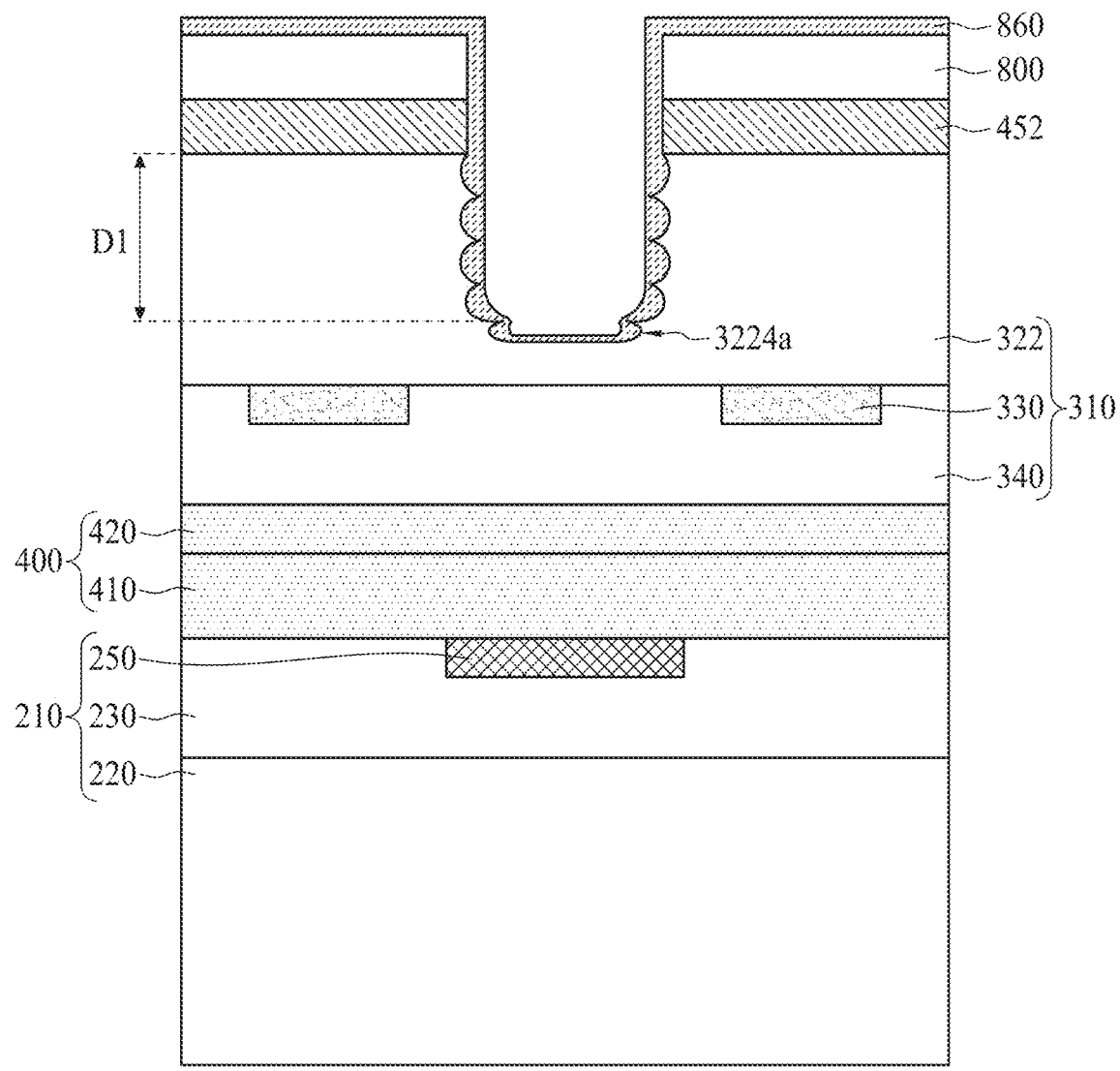
Figure 22:
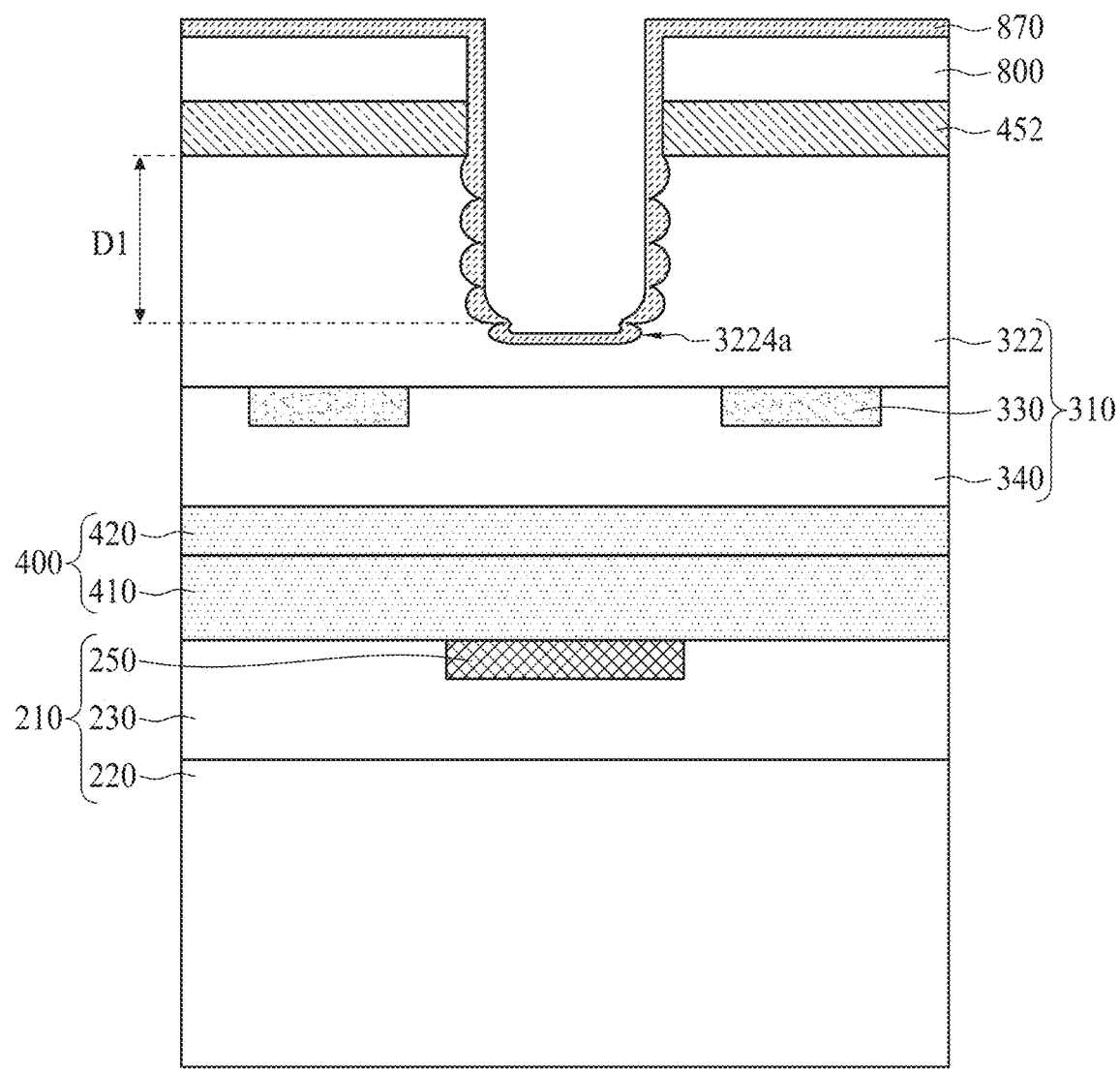
Figure 23:
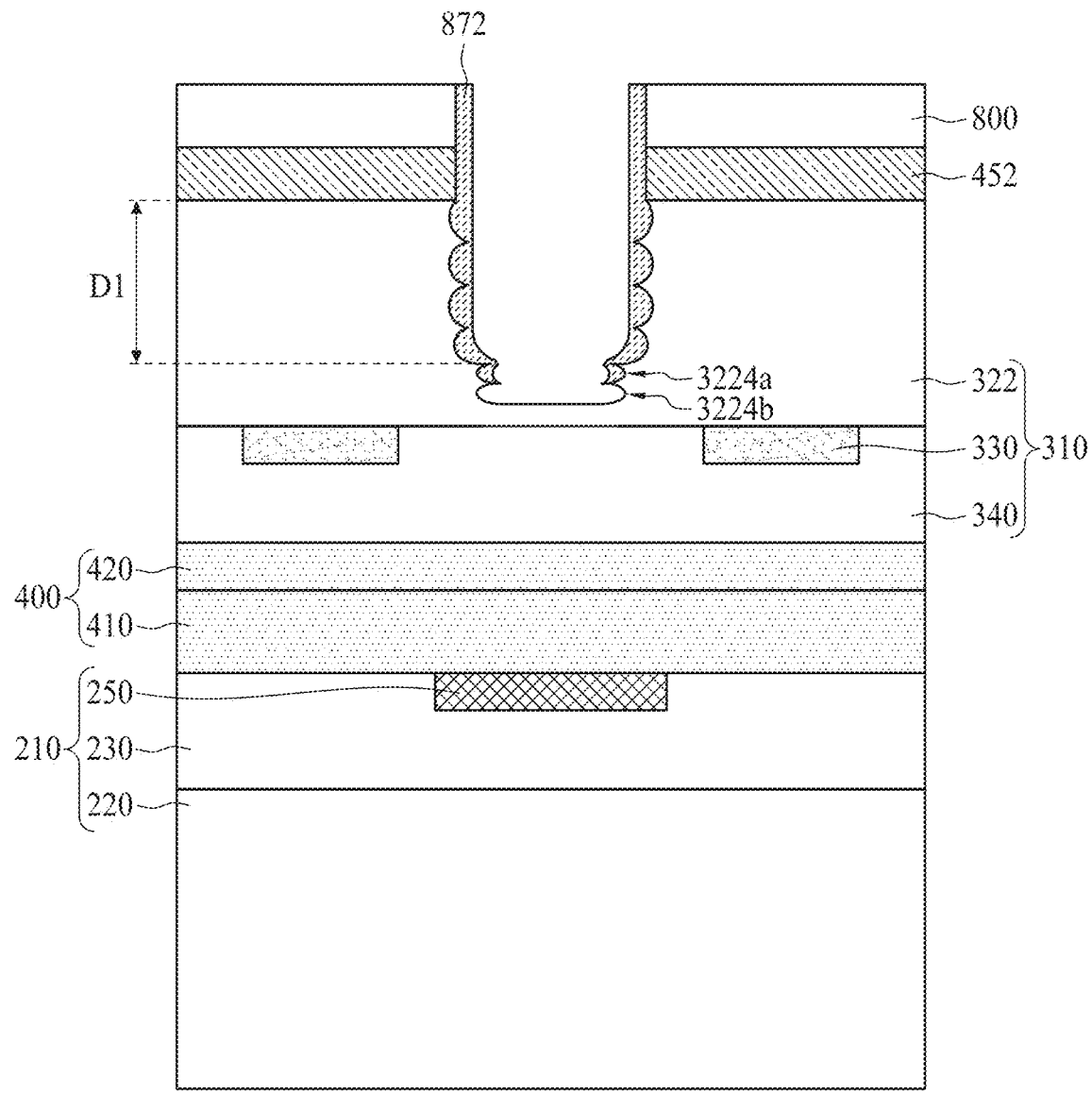
Figure 24:
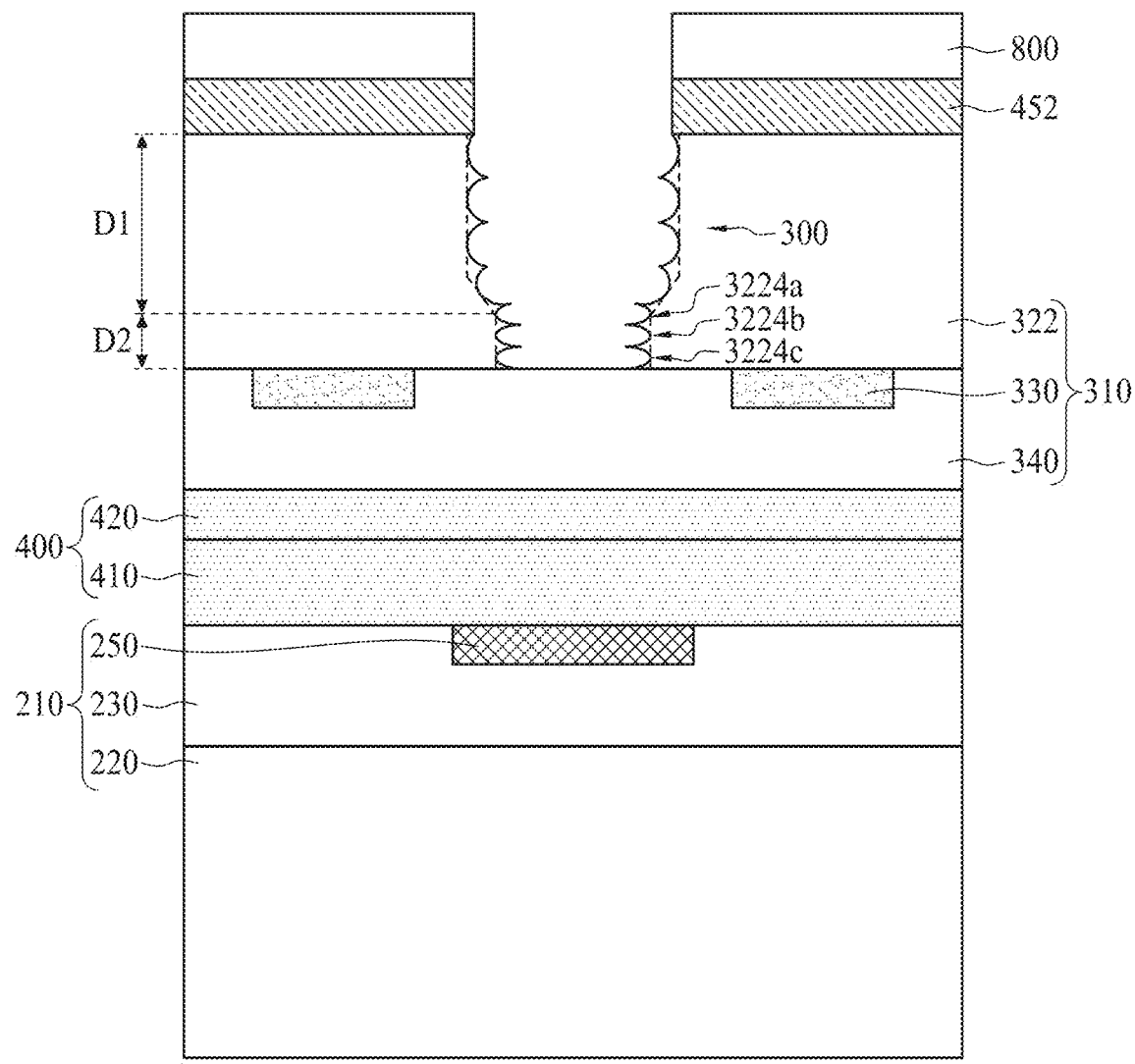

Once the etching step is completed, the first deposition step is repeated to deposit the same type of sacrificial material to form another sacrificial film 860 at least on a portion of the substrate 322 exposed by the second recess 3224a, as shown in FIG. 21. Next, a sequence of the second deposition step for defining a region to be etched into the substrate 322 (as shown in FIG. 22) and the etching step to remove portions of the sacrificial film 870 formed during the second deposition step and the substrate 322 is repeated to create another second recess 3224b, as shown in FIG. 23. A sequence of the first deposition step, the second deposition step and the etching step is repeated to etch the substrate 322 until the insulative layer 340 of the second semiconductor device 310 is exposed, as shown in FIG. 24. Accordingly, the trench 300 is formed. In some embodiments, the second cyclic process may create three second recesses 3224a to 3224c, connected to each other, in the substrate 322. Notably, the formation of the second recesses 3224a to 3224c may be performed in-situ during the formation of first recesses 3222a to 3222d.

As shown in FIG. 24, the selected depth D1 for the formation of the first recesses 3222a to 3222d is determined by the default depth D2 for the formation of the second recesses 3224a to 3224c. In detail, the trench 300 comprised of the first recesses 3222a to 3222d and the second recesses 3224a to 3224c is used for forming a conductive feature as described below, and therefore the default depth D2 is designed to prevent the main components 330 from suffering serious performance degradation due to the conductive feature.

Figure 25:
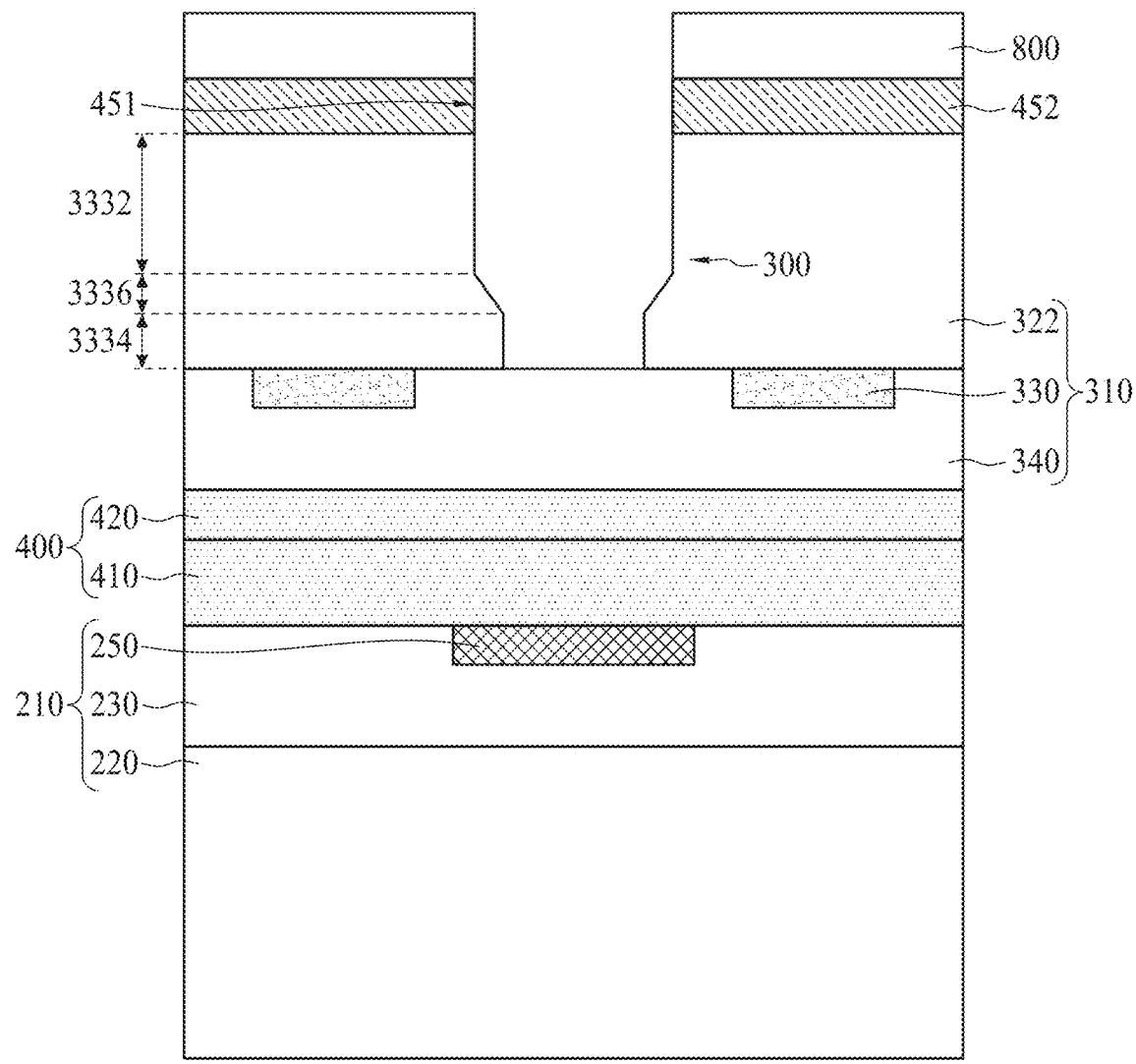

After the second cyclic process is completed, a cleaning process is performed to remove residual sacrificial film. The stack of the first and second semiconductor devices 210 and 310 is cleaned using, for example, a wet clean process. As shown in FIG. 24, the undercutting resulting from the etching steps in the first and second cyclic processes causes the trench 300 to be a steep-sided hole. That is, an inner surface of the substrate 322, interfaced with the trench 300, has a scalloped pattern. Generally, it is difficult to form a desired film homogeneously on the inner wall of the substrate 322 having the scalloped pattern, and yield and reliability of the semiconductor assembly are limited accordingly. Therefore, a removal process may be performed to flatten (i.e., smooth) the inner wall of the substrate 322, as shown in FIG. 25. In some embodiments, the scalloped pattern is etched by, for example, a reactive ion etching (RIE) process. After the removal process, the inner surface of the substrate 332 may include three segments: a first vertical surface 3332, a second vertical surface 3334 and an inclined surface 3336 connected to the first vertical surface 3332 and the second vertical surface 3334.

Figure 26:
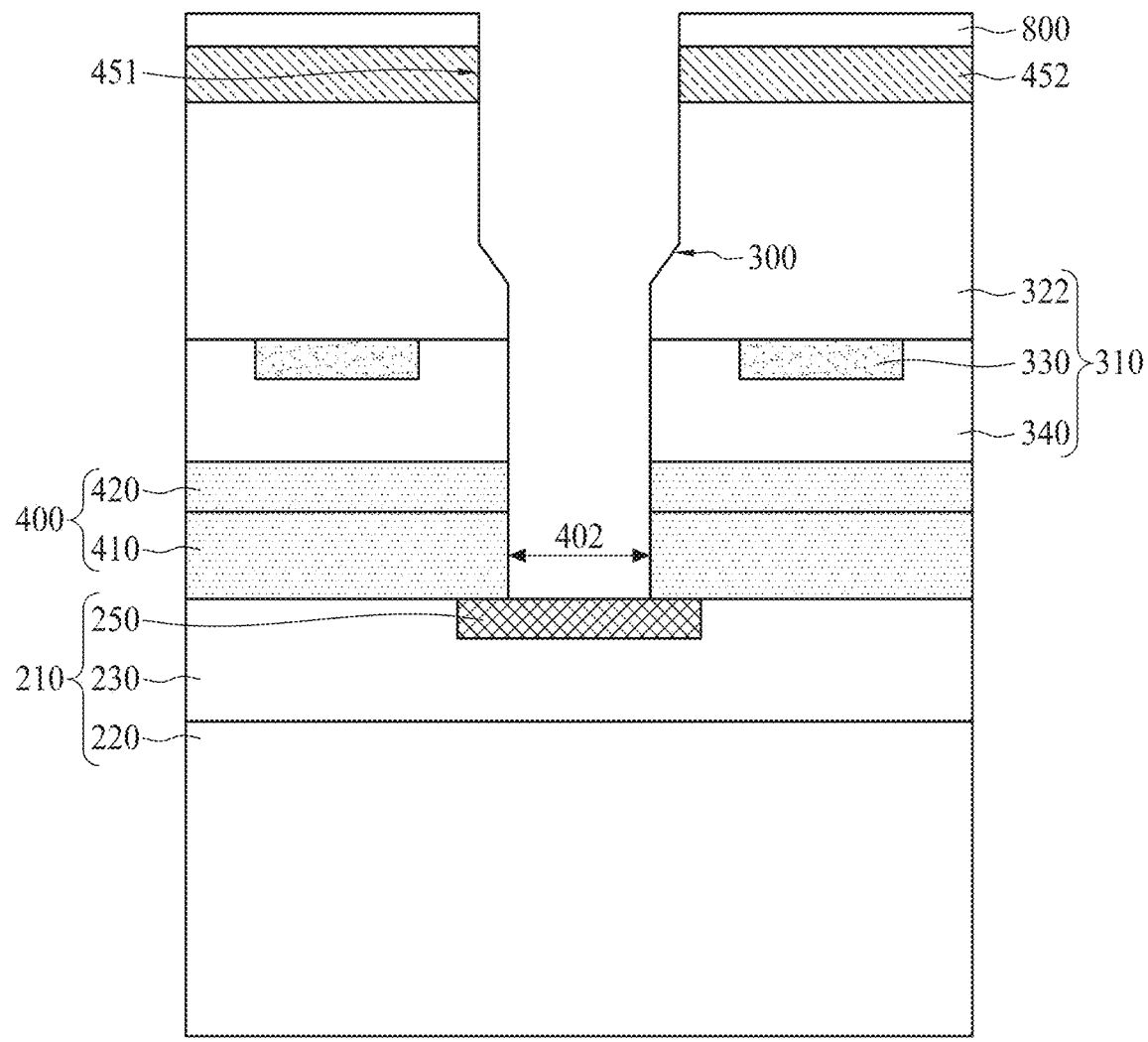

Referring to FIG. 26, a portion of the insulative layer 340 of the second semiconductor device 310 and a portion of the bonding layer 400 below the trench 300 are subsequently removed to expose the conductive pad 250 of the first semiconductor device 210 according to a step S716 in FIG. 3. Accordingly, a hole 402 is formed. The insulative layer 340 and the bonding layer 400 are anisotropically dry-etched, using at least one RIE process, for example. It should be noted that the etching process may utilize multiple etchants, selected based on the materials of the insulative layer 340 and the bonding layer 400, to sequentially etch the insulative layer 340 and the bonding layer 400. In some embodiments, the photoresist mask 800 that protects the passivation layer 452 from damage during the etching steps in the first and second cyclic process may be greatly consumed during the etching of the portions of the insulative layer 340 and the bonding layer 400; the residue of the photoresist mask 800 can be then removed using an ashing process or a strip process, for example, wherein the wet strip process may chemically alter the photoresist mask 800 so that it no longer adheres to the passivation layer 452.

Figure 27:
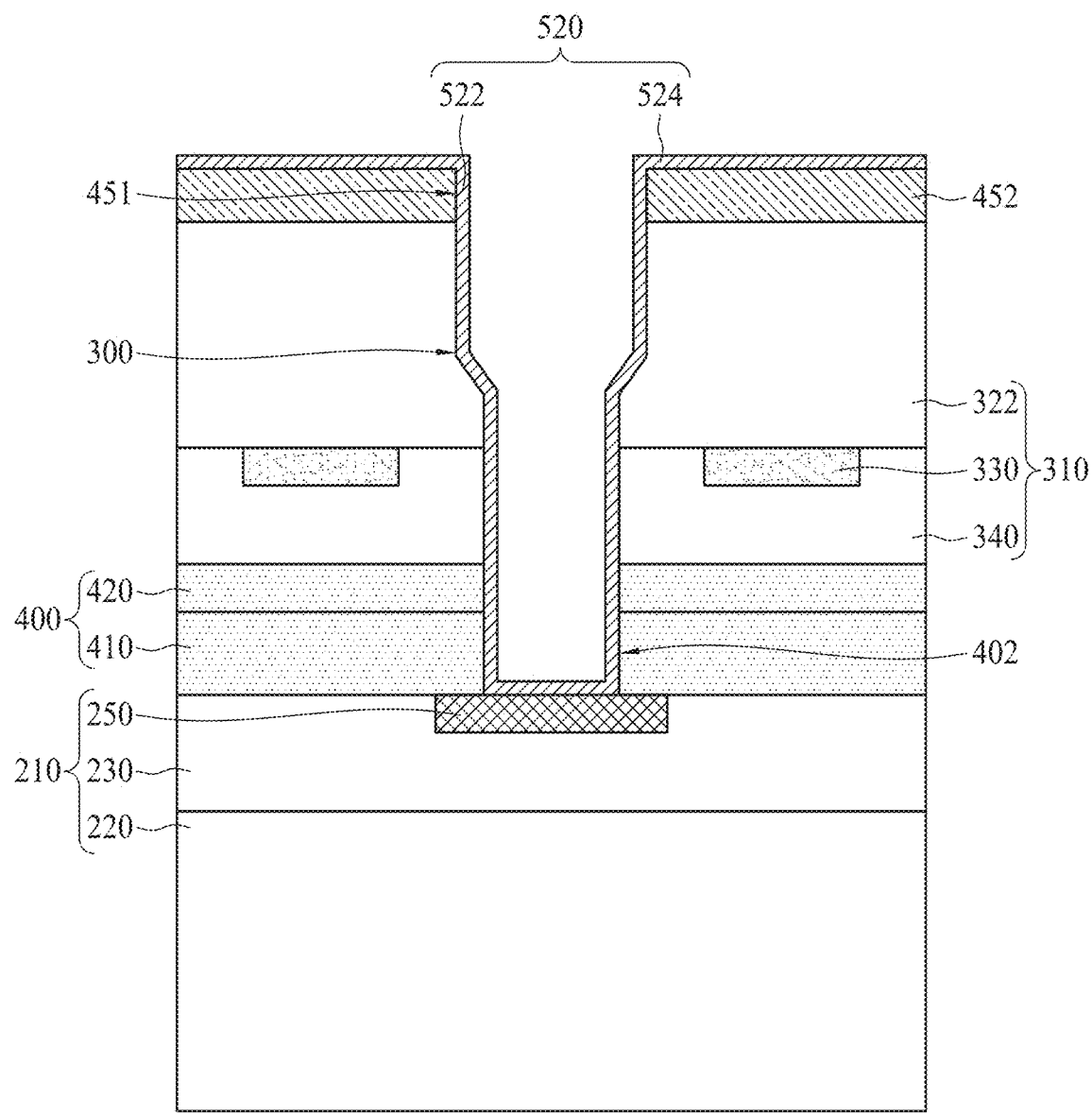

Referring to FIG. 27, an isolation film 520 is deposited in the opening 451, the trench 300 and the hole 402 according to a step S718 in FIG. 3. The isolation film 520 is a conformal layer that has a topology following the topology of the exposed portions of the passivation layer 452, the substrate 322 of the second semiconductor device 310, the bonding layer 400, and the contact pad 250 of the first semiconductor device 210. Byway of example, the isolation film 520 includes oxide, nitride, oxynitride or high-k material and can be deposited using a CVD process, an ALD process, or the like. In some embodiments, the isolation film 520 and the bonding layer 400 can have the same material, but the present disclosure is not limited thereto.

Figure 28:
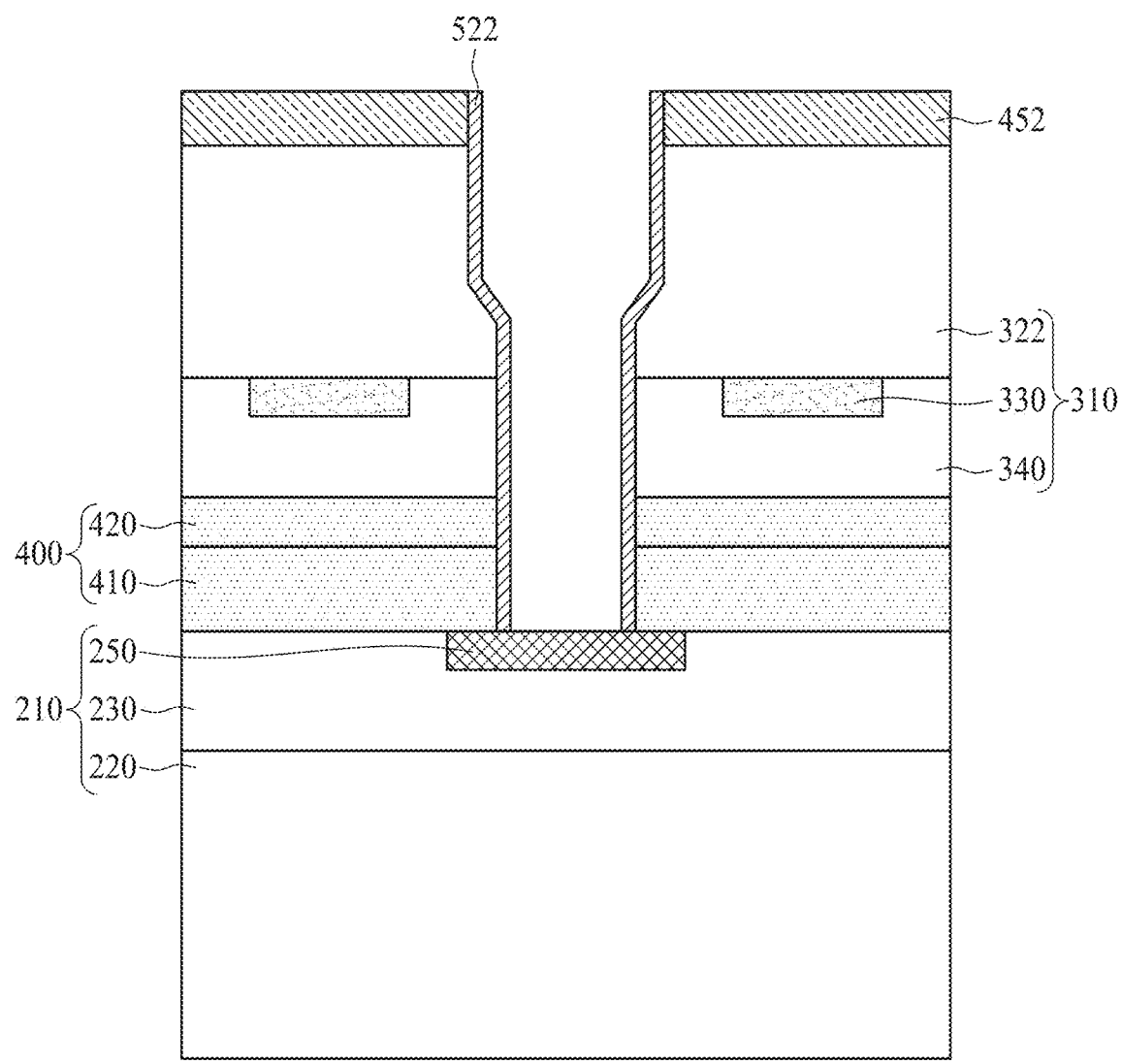

Referring to FIGS. 27 and 28, a portion of the isolation film 520 is removed to expose the conductive pad 250 according to a step S720 in FIG. 3. In step S720, horizontal portions 524 of the isolation film 520 are removed using an anisotropic etching process, while vertical portions 522 of the isolation film 520 are left in place, thereby forming at least one isolation liner. The chemistry of the anisotropic etching process can be selective to the material of the isolation film 520. As a result, no substantial quantity of the material of the passivation layer 452 is removed during the etching of the horizontal portions of the isolation film 520.

Figure 29:
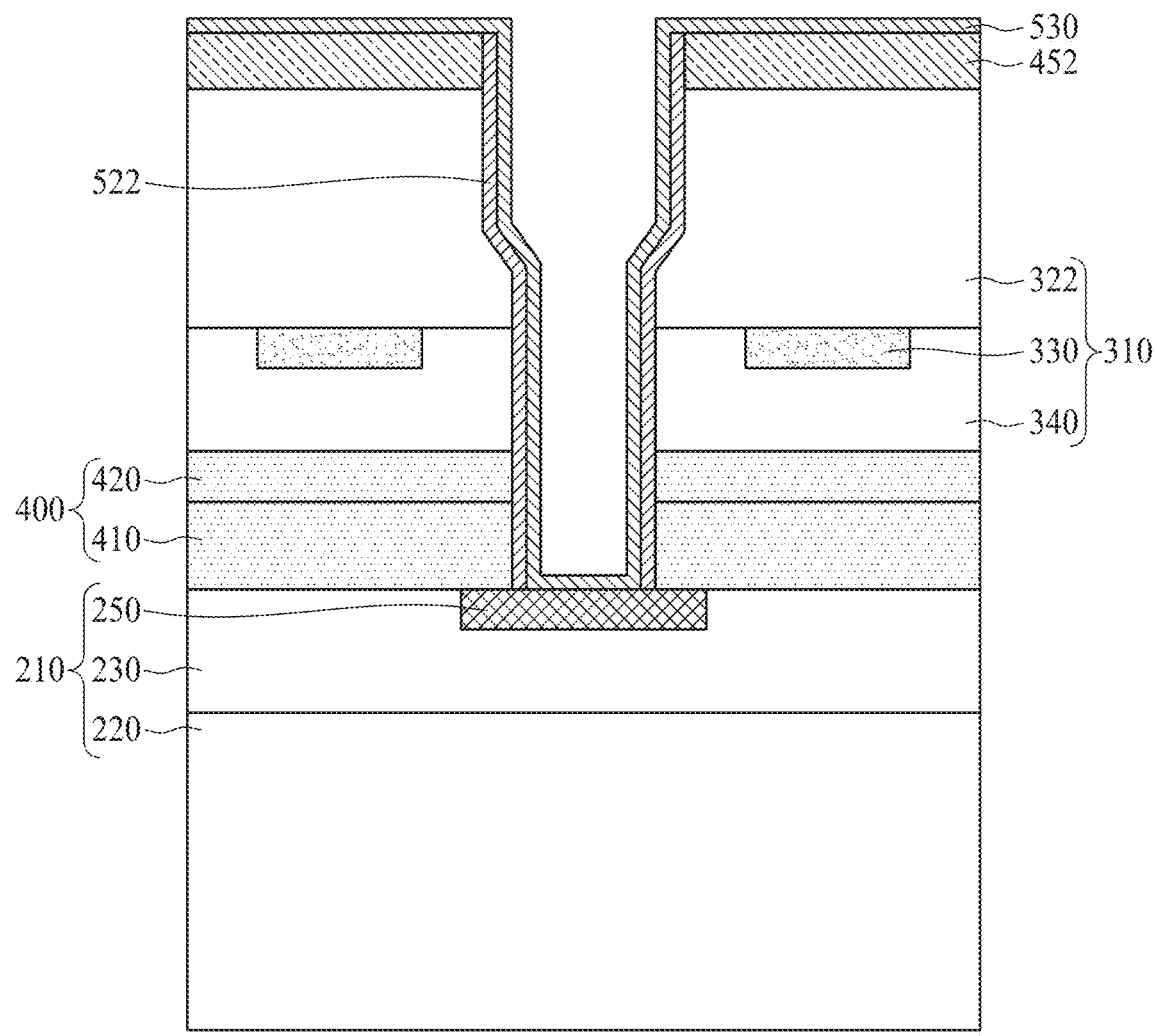

Referring to FIG. 29, a diffusion barrier film 530 is deposited on the exposed portions of the conductive pad 250, the passivation layer 452, and the isolation liner 522 according to a step S722 in FIG. 3. The diffusion barrier film 530, having a substantially uniform thickness, caps the conductive pad 250, the passivation layer 452, and the isolation liner 522. In order to secure the step coverage, the diffusion barrier film 530 can be formed using a PVD process or an ALD process, for example. The diffusion barrier film 530 may be a single-layered structure or a multi-layered structure including one or more refractory metals, refractory metal nitrides, or refractory metal silicon nitrides.

Figure 30:
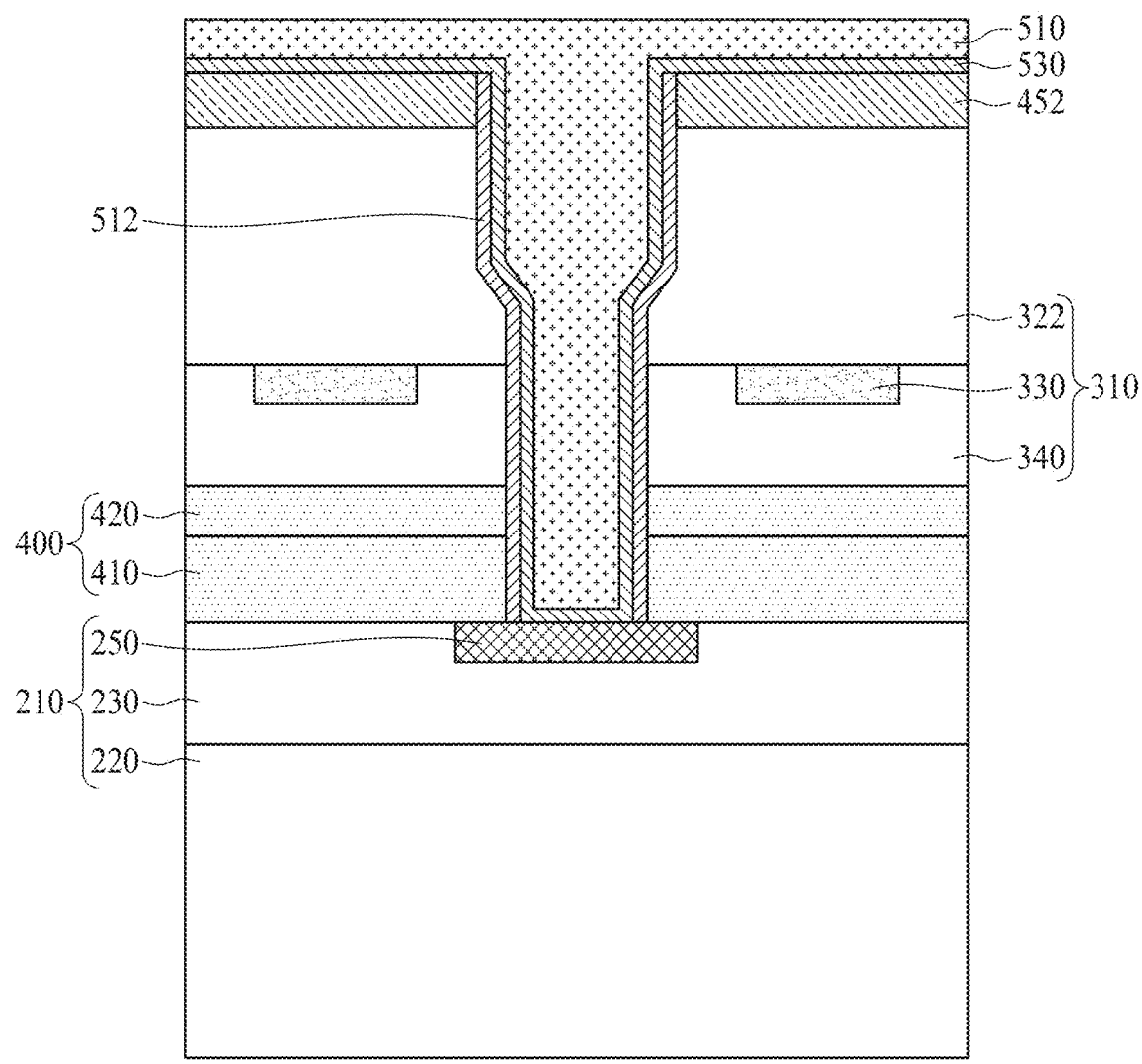

Referring to FIG. 30, a conductive material 510 is deposited to fill the opening 451, the trench 300 and the hole 402 according to a step S724 in FIG. 3. The conductive material 510 is conformally and uniformly deposited on the diffusion barrier film 530 until the opening 452, the trench 300 and the hole 402 are completely filled. The diffusion barrier film 530 is employed to prevent the conductive material 510 from flaking or spalling from the isolation liner 522. The conductive material 510 may include metal, such as copper, tungsten, aluminum, silver, gold, indium or the like. The isolation liner 522 is employed to separate the conductive material 510 from the substrate 322, thereby preventing the conductive material 510 from diffusing into the substrate 530. The conductive material 510 may be deposited using a CVD process, a PVD process, an ALD process, or another suitable process.

Subsequently, a planarizing process is performed to remove the conductive material 510 and the diffusion barrier film 530 overflowing the opening 451, the trench 300 and the hole 402. Consequently, the semiconductor assembly 20 shown in FIG. 1 is completely formed. The passivation layer 452 is exposed, and a conductive feature 500, shown in FIG. 1, is formed. The planarizing process can include a chemical mechanical polishing (CMP) process and/or a wet etching process.

In conclusion, the configuration of the semiconductor assembly 20 or the semiconductor device 60 includes the conductive feature 500/630 including the first block 502/632 with a smallest critical dimension in the vicinity of the main components and a second block 504/634 with a greatest critical dimension distal from the main components. Accordingly, the area utilization of the substrate 322/610 where the conductive feature 500/630 is disposed is increased.

One aspect of the present disclosure provides a semiconductor device. The semiconductor device comprises a substrate, a conductive feature, an isolation liner and a main component. The conductive feature is disposed in the substrate and comprises a first block, a second block and a third block. The first block has a uniform first critical dimension, and the second block has a uniform second critical dimension greater than the first critical dimension. The third block is interposed between the first block and the second block and has varying third critical dimensions. The isolation liner covers a periphery of the conductive feature. The main component is disposed in the substrate and around the first block.

One aspect of the present disclosure provides a semiconductor assembly. The semiconductor assembly comprises a first semiconductor device, a second semiconductor device, a conductive feature, and an isolation liner. The first semiconductor device comprises a conductive pad. The second semiconductor device is vertically stacked on the first semiconductor device. The conductive feature, penetrating through the second semiconductor device, comprises a first block, a second block and a third block. The first block is in contact with the conductive pad and has a first critical dimension. The second block is connected to the first block and has a second critical dimension greater than the first critical dimension. The isolation liner is interposed between the second semiconductor device and the conductive feature.

One aspect of the present disclosure provides a method of manufacturing a semiconductor assembly. The method comprises steps of bonding a first semiconductor device and a second semiconductor device together; performing a first cyclic process to create a plurality of first recesses in communication with each other in a substrate of the second semiconductor device, wherein the first recesses have a first width; performing a second cyclic process to create a plurality of second recesses in communication with each other through the first recesses, wherein the second recesses have a second width less than the first width; forming an isolation liner on a portion of the substrate exposed through the first and second recesses; and depositing a conductive material in the first and second recesses coated with the isolation liner.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
a substrate;
a conductive feature disposed in the substrate and comprising:
a first block having a uniform first dimension;
a second block having a uniform second dimension greater than the first dimension; and
a third block interposed between the first block and the second block and having varying third dimensions gradually decreasing from the uniform second dimension to the uniform first dimension along a direction from the second block to the first block to form an inclined peripheral surface of the third block;
an isolation liner covering a periphery of the conductive feature; and
a main component disposed in the substrate and around the first block.

2. The semiconductor device of claim 1, wherein the third dimension of the third block of the conductive feature gradually increases at positions of increasing distance from the first block, and gradually decreases at positions of increasing distance from the second block.

3. The semiconductor device of claim 1, wherein the first block of the conductive feature has a first height, the second block of the conductive feature has a second height greater than the first height, and the third block of the conductive feature has a third height less than the first height.

* * * * *